United States Patent
Xu

(10) Patent No.: US 10,151,838 B2
(45) Date of Patent: Dec. 11, 2018

(54) IMAGING SENSOR WITH SHARED PIXEL READOUT CIRCUITRY

(71) Applicant: Microsoft Technology Licensing, LLC, Redmond, WA (US)

(72) Inventor: Zhanping Xu, Sunnyvale, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 76 days.

(21) Appl. No.: 14/950,313

(22) Filed: Nov. 24, 2015

(65) Prior Publication Data

US 2017/0146657 A1    May 25, 2017

(51) Int. Cl.
*G01S 17/89*    (2006.01)
*H04N 13/207*    (2018.01)
(Continued)

(52) U.S. Cl.
CPC ............ *G01S 17/89* (2013.01); *G01S 7/4863* (2013.01); *G01S 17/36* (2013.01); *H01L 27/1464* (2013.01); *H01L 27/14621* (2013.01); *H01L 27/14641* (2013.01); *H01L 27/14649* (2013.01); *H04N 5/2256* (2013.01); *H04N 5/332* (2013.01); *H04N 5/3698* (2013.01); *H04N 5/378* (2013.01); *H04N 5/37457* (2013.01); *H04N 9/045* (2013.01); *H04N 13/207* (2018.05); *H04N 13/257* (2018.05)

(58) Field of Classification Search
CPC ........... H01L 27/1464; H01L 27/14641; H01L 27/14649; H04N 5/332; H04N 5/3698; H04N 5/37457; H04N 5/378; H04N 5/2256; H04N 9/045; H04N 13/0207; H04N 13/0257

USPC ....................................................... 250/208.1
See application file for complete search history.

(56) References Cited

U.S. PATENT DOCUMENTS 7,804,536 B2    9/2010    Blerkom
7,855,740 B2    12/2010    Hamilton et al.
(Continued)

FOREIGN PATENT DOCUMENTS

EP      2890125 A1     7/2015
WO      2013104718 A2  7/2013

OTHER PUBLICATIONS

"International Search Report and Written Opinion Issued in PCT Application No. PCT/US2016/062381", dated Feb. 1, 2017, 12 Pages.
(Continued)

*Primary Examiner* — Yogesh Aggarwal

(57) ABSTRACT

Imaging sensors that detect infrared and visible light are provided herein. In one example, an imaging sensor is presented that includes a semiconductor substrate comprising an array of pixel structures for concurrently sensing infrared light and visible light. Each of the pixel structures include a first pixel element configured to detect the infrared light and a second pixel element configured to detect the visible light. Each of the pixel structures further include a shared output circuit that couples the first pixel element and the second pixel element such that a first output state presents a first signal corresponding to detected infrared light of the first pixel element and a second output state presents a second signal corresponding to detected visible light of the second pixel element.

14 Claims, 15 Drawing Sheets

(51) Int. Cl.
| | |
|---|---|
| *H04N 13/257* | (2018.01) |
| *H04N 5/225* | (2006.01) |
| *H04N 5/33* | (2006.01) |
| *H04N 5/369* | (2011.01) |
| *H04N 5/378* | (2011.01) |
| *H01L 27/146* | (2006.01) |
| *H04N 5/3745* | (2011.01) |
| *H04N 9/04* | (2006.01) |
| *G01S 17/36* | (2006.01) |
| *G01S 7/486* | (2006.01) |

(56) References Cited

U.S. PATENT DOCUMENTS

| | | |
|---|---|---|
| 8,134,637 B2 | 3/2012 | Rossbach et al. |
| 8,218,068 B2 | 7/2012 | Deever et al. |
| 8,355,565 B1 | 1/2013 | Yang et al. |
| 8,587,771 B2 | 11/2013 | Xu et al. |
| 8,659,698 B2 | 2/2014 | Blayvas et al. |
| 8,670,029 B2 | 3/2014 | McEldowney |
| 9,030,528 B2 | 5/2015 | Pesach et al. |
| 2010/0102366 A1 | 4/2010 | Lee et al. |
| 2011/0292380 A1 | 12/2011 | Bamji |
| 2012/0154535 A1 | 6/2012 | Yahav et al. |
| 2013/0010072 A1 | 1/2013 | Kim et al. |
| 2013/0020463 A1 | 1/2013 | Lee et al. |
| 2013/0147979 A1* | 6/2013 | McMahon ............ H04N 5/335 348/218.1 |
| 2014/0217474 A1 | 8/2014 | Lee et al. |
| 2014/0293102 A1* | 10/2014 | Vogelsang ........... H04N 5/3535 348/294 |

OTHER PUBLICATIONS

"Second Written Opinion Issued in PCT Application No. PCT/US2016/062381", dated Jul. 18, 2017, 7 Pages.

Henry, et al., "RGB-D Mapping: Using Kinect-Style Depth Cameras for Dense 3D Modeling of Indoor Environments", In International Journal of Robotics Research archive, vol. 31, Issue 5, Apr. 2012, pp. 1-28.

Yang, et al., "Spatial-Depth Super Resolution for Range Images", In Proceedings of IEEE Conference on Computer Vision and Pattern Recognition, Jun. 17, 2007, 8 pages.

Zhangping Xu; "Investigation of 3D-Imaging Systems Based on Modulated light and Optical RF-Interferometry (ORFI);" A dissertation submitted to the Department of Electrical Engineering and Computer Science at University of Siegen; Dec. 21, 1998; pp. 1-197.

"International Preliminary Report on Patentability Issued in PCT Application No. PCT/US2016/062381", dated Feb. 26, 2018, 8 Pages.

* cited by examiner

IMAGING SENSOR WITH SHARED PIXEL READOUT CIRCUITRY

BACKGROUND

Digital imaging sensors are employed in many devices and systems to capture images, such as in digital cameras. Imaging sensors employ large semiconductor arrays of detection pixels that can comprise charge-coupled devices (CCDs) or complementary metal oxide semiconductor (CMOS) devices, among others. The imaging sensors can be configured to capture a range of the electromagnetic spectrum that spans both visible light and infrared light ranges.

When configured to capture infrared light, the imaging sensors can be employed in time-of-flight (TOF) camera systems. TOF cameras measure a depth of a scene using emission of infrared light that is precisely timed to measurement or detection by an imaging sensor. These TOF cameras can be employed in many applications where identifying relative depths among objects in a scene is useful, such as interactive gaming devices, virtual reality devices, augmented reality devices, industrial controls, medical scanners, or other devices.

Overview

Systems, apparatuses, and methods that employ imaging sensors to detect infrared and visible light are provided herein, such as time-of-flight (TOF) measurement devices and associated imaging sensor arrays. In one example, an imaging sensor is presented that includes a semiconductor substrate comprising an array of interspersed pixel structures for concurrently sensing infrared light and visible light. Each of the pixel structures include at least a first pixel element configured to detect the infrared light and at least a second pixel element configured to detect the visible light. Each of the pixel structures further include a shared output circuit that couples at least the first pixel element and at least the second pixel element such that a first output state presents a first signal corresponding to detected infrared light of the first pixel element and a second output state presents a second signal corresponding to detected visible light of the second pixel element.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

TECHNICAL DISCLOSURE

Time-of-flight (TOF) based three-dimensional (3D) cameras have found several applications in industrial automation, medical imaging, automotive driving assistance, virtual reality systems, augmented reality systems, as well as gaming and other consumer areas. TOF sensors can deliver depth information of 3D images by using active illumination for measurement. Many times, the maximum depth that can be detected by a TOF system is limited by infrared filtering components which can reduce sensitivity of the infrared sensor and attenuate detected intensity of the infrared illumination system. Visible imaging sensors can be employed to augment the infrared imaging to overcome some of the limitations on depth of field with infrared imaging sensors. Although a TOF sensor can provide monochromatic two-dimensional (2D) images using common mode outputs, the 2D images can be depth-restricted by associated infrared (IR) filter components when objects in a scene are at a far distance.

In some examples, a separate black-and-white or red/green/blue (RGB) visible-spectrum camera is included, which can lead to bulky imaging equipment as well as increased manufacturing cost and system power consumption. In some instances, two sets of separated imaging sensors are included on the same sensor array, which can increase the architectural complexity of the pixel array. Some systems have combined infrared imaging sensors with visible imaging sensors into a single device or onto a silicon wafer used in a microchip. However, separation distances of the two imaging sensors can lead to parallax issues. Moreover, these devices still encounter problems with high power consumption and sensitivity of the individual pixels. When separate imaging sensors are employed, in can be difficult to ensure accurate timing between capture of visible and infrared images, which can cause problems during image processing and TOF calculations.

In the examples herein, various enhanced imaging sensors and pixel arrangements are discussed which can be employed in TOF camera systems, among other imaging applications. As discussed below, a pixel array architecture and timing method are discussed to overcome problems by using a single pixel arrangement to detect both passive 2D images (RGB or BW) as well as active 3D images (i.e.

TOF), which enhances the spatial resolution of an imaging sensor and also reduces system cost and power consumption.

Visible light and infrared (IR) light are discussed herein. Visible light typically comprises wavelengths of light that correspond to the visual range of a human eye, approximately wavelengths 390 nanometers (nm) to 700 nm. IR light comprises wavelengths of light that extend from approximately 700 nanometers to 1 millimeter (mm). Variations of wavelength ranges are possible, but in general visible light and IR light discussed herein refer to the above approximate ranges.

Figure 1:
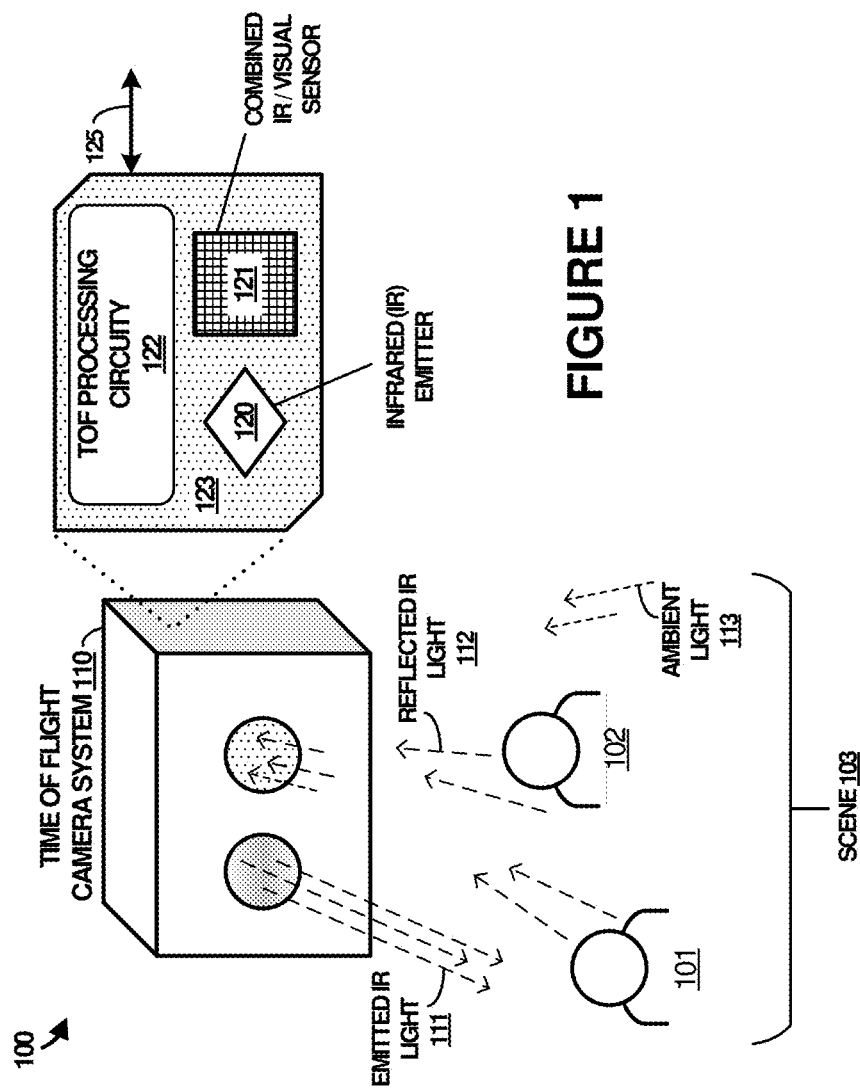
FIG. 1 illustrates a time of flight camera environment in an implementation.

As a first example, FIG. 1 is presented. FIG. 1 is a system diagram illustrating TOF camera environment 100. Environment 100 includes time of flight camera system 110 and scene elements 101-102. A detailed view of TOF camera system 110 is shown including infrared emitter 120, combined IR/visible sensor 121, and TOF processing circuitry 122 mounted on one or more circuit boards 123. TOF camera system 110 communicates with external systems over communication link 125. In some examples, elements of IR emitter 120 and image processing circuitry are included in sensor 121.

In operation, TOF camera system 110 emits IR light 111 using IR emitter 120 to illuminate elements in scene 103, such as scene elements 101-102. IR light 111 reflects off objects and elements in scene 113 and is received as reflected IR light 112 by sensor 121. Sensor 121 detects reflected IR light 112 as well as objects and elements in the scene illuminated by ambient light 113. Sensor 121 can detect both IR light and visible light using an array of pixels that are interspersed with each other on a semiconductor substrate of sensor 121.

Once the IR and visible light is detected by sensor 121, pixel data representative of this detected light is provided to TOF processing circuitry 122 which processes the pixel data to determine one or more images, with at least one of the images comprising a depth map of the scene resultant from IR illumination and another other the images comprising a passive visible image resultant from ambient light 113. Each pixel in sensor 121 can have an associated filtering element to allow detection of either IR light or selective portions of the visible light, which will be discussed in more detail below.

Referring back to the elements of FIG. 1, IR emitter 120 can comprise one or more infrared light emitters, such as light-emitting diodes (LEDs), laser emitters, laser diode emitters, or other components. IR emitter 120 can also include various driver circuitry configured to provide power to IR emitter 120 and synchronize emission of IR light with timing signals provided by TOF processing circuitry 122.

Sensor 121 comprises an array of pixels formed on a semiconductor substrate, along with associated driver, power, and output circuitry. The individual pixels can incorporate techniques and semiconductor structures found in CCD pixels or CMOS pixels, among other semiconductor-based light detection techniques and elements. Further examples of sensor 121 will be discussed in FIGS. 3-13 herein.

Link 125 comprises one or more wired or wireless communication links for communicating with external systems, such as computing devices, microprocessors, servers, network devices, smartphone devices, or other processing systems. Link 125 can carry imaging data and related data, such determined by TOF camera system 110, or can carry commands and instructions transferred by an external control system. Link 125 can comprise a Universal Serial Bus (USB) interface, Peripheral Component Interconnect Express (PCIe) interface, wireless interface, IEEE 802.15 (Bluetooth) wireless link, IEEE 802.11 (WiFi) wireless link, Direct Media Interface (DMI), Ethernet interface, networking interface, serial interface, parallel data interface, or other communication or data interface, including combinations, variations, and improvements thereof.

Figure 2:
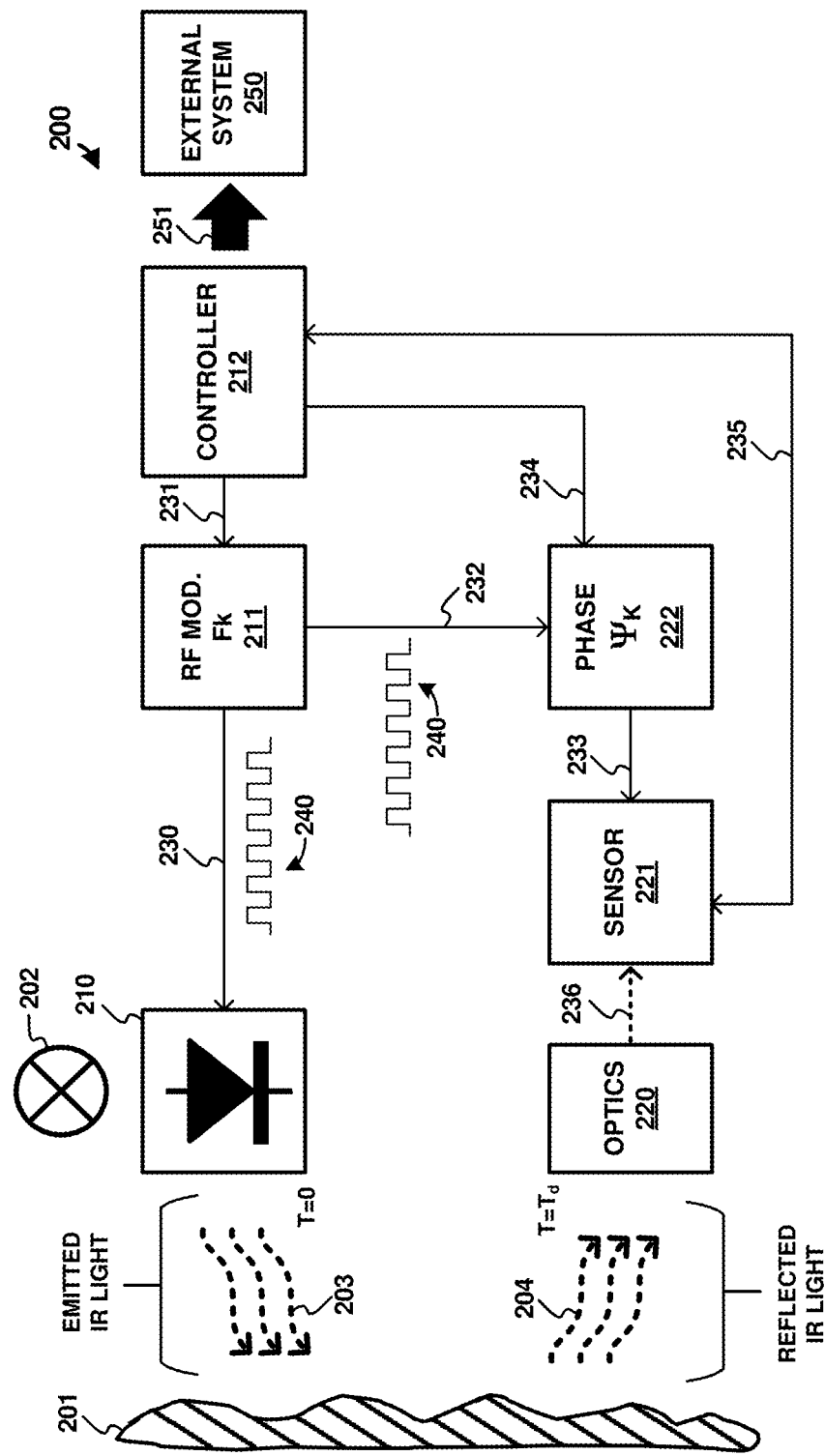
FIG. 2 illustrates a system diagram of a time of flight sensing system in an implementation.

To further illustrate the elements of FIG. 1 and provide a detailed view of one example TOF camera system, FIG. 2 is presented. FIG. 2 is a block diagram illustrating TOF sensing system 200, which can be an example of any of the TOF systems discussed herein. Elements of system 200 can be incorporated into elements of TOF camera system 110. FIG. 2 includes object of interest 201 within a scene which is imaged by system 200 to identify TOF information for at least object 201 and provide this information to external system 250 over communication link 251. The TOF information, such as a TOF signal, can comprise a signal proportional to a phase shift between infrared light pulses detected and a reference signal. The TOF signal can be used to determine distances to objects in a scene, such as object 201, from which infrared light was reflected.

System 200 includes IR emitter 210, radio frequency (RF) modulator 211, controller 212, optics 220, sensor 221, and phase module 222. RF modulator 211 comprises a system oscillator that generates RF modulation signal 240 and is controlled by controller 212 over link 231. RF modulation signal 240 is provided to IR emitter 210 over link 230 for emission as IR light 203. Emitted IR light 203 is modulated according to RF modulation signal 240 by IR emitter 210, and illuminates object 201.

Experiencing a time-of-flight time delay, the back scattered reflected IR light 203 is received by optics 220 and provided via optical path 236 onto sensor 221. Sensor 221 includes at least one pixel or one array of pixels. RF modulator 211 simultaneously transfers a reference signal as RF modulation signal 240 over link 232 to phase module 222. Phase module 222 is controlled by controller 212 over link 234. Phase module 222 shifts the phase of signal 240 generated by RF modulator 211 and transmits the phase-shifted signal over link 233 to infrared pixels used for TOF sensing in sensor array 221. This phase-shifted signal can be used in performing demodulation/phase processes discussed in further examples below. Sensor 221 can simultaneously detect both IR light and visible light. Visible light detection is provided by visible light source 202, which in some examples comprises ambient light.

Turning to the elements of FIG. 2, IR emitter 210 can comprise a light-emitting diode, diode laser, or other IR light emitter which can be modulated according to RF modulation signal 240. RF modulator 211 comprises various circuitry to generate an RF modulated signal based on control instructions from controller 212. RF modulator 211 can include crystal oscillators, clock generation circuitry, phase-locked loop (PLL) circuitry, or other modulation circuitry. Phase module 222 comprises a phase comparator circuit which can produce phase shifts between RF modulation signal 240 and a signal sent over link 233 from sensor 221 for use in determining a time-of-flight (TOF) signal. In some examples, RF modulator 211 and phase module 222 are combined into a single circuit module. Sensor 221 comprises an IR/visible light sensor used for determining TOF information of object 201. Sensor 221 includes elements discussed herein for the various pixel arrays and pixel architectures. Optics 220 can comprise optical interfacing elements that can pass and focus both visible light and IR light. Optics 220 can include prisms, optical adhesives, lenses, mirrors, diffusers, optical fibers, and the like, to optically couple incident light onto sensor 221. Links 230-235 can each comprise wired or wireless links to interconnect the associated modules of FIG. 2. When combined onto one or more printed circuit boards, links 230-235 can comprise printed circuit traces.

Figure 15:
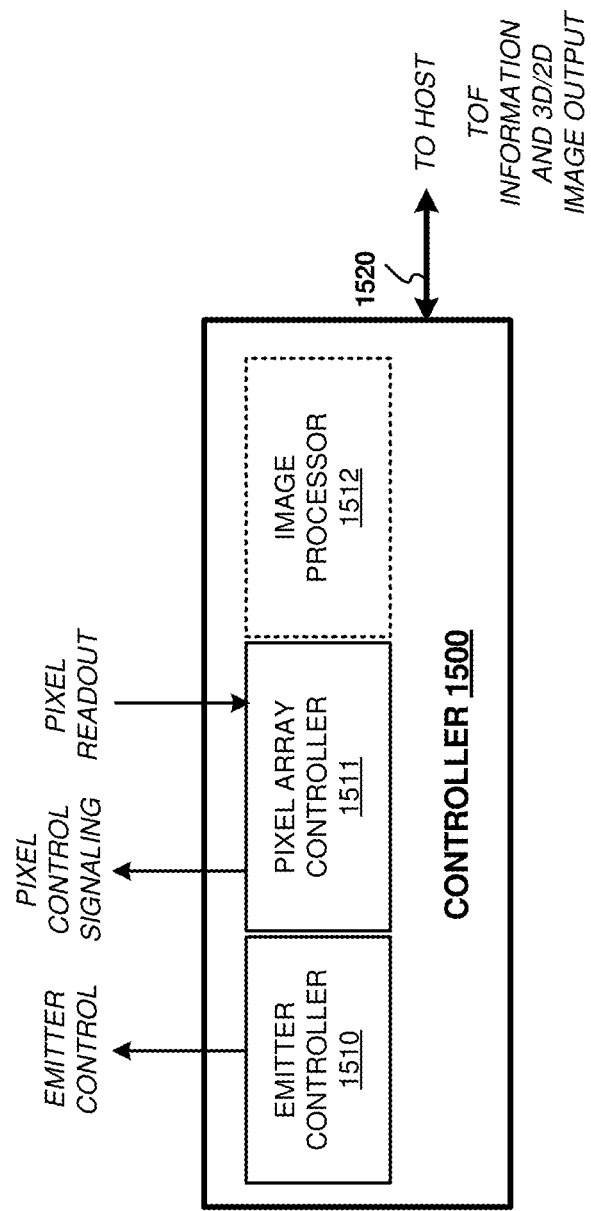
FIG. 15 illustrates an example controller suitable for implementing any of the architectures, processes, methods, and operational scenarios disclosed herein.

Controller 212 can include communication interfaces, network interfaces, processing systems, computer systems, microprocessors, storage systems, storage media, or some other processing devices or software systems, and can be distributed among multiple devices. Examples of controller 212 can include software such as an operating system, logs, databases, utilities, drivers, caching software, networking software, and other software stored on non-transitory computer-readable media. A further example of controller 212 is shown in FIG. 15. External system 250 can comprise a network device, computing device, gaming platform, virtual reality system, augmented reality system, or other device, including combinations thereof. System 200 can also include power supply circuitry and equipment, enclosures, chassis elements, or ventilation/cooling systems, among other elements not shown in FIG. 2 for clarity.

Figure 3:
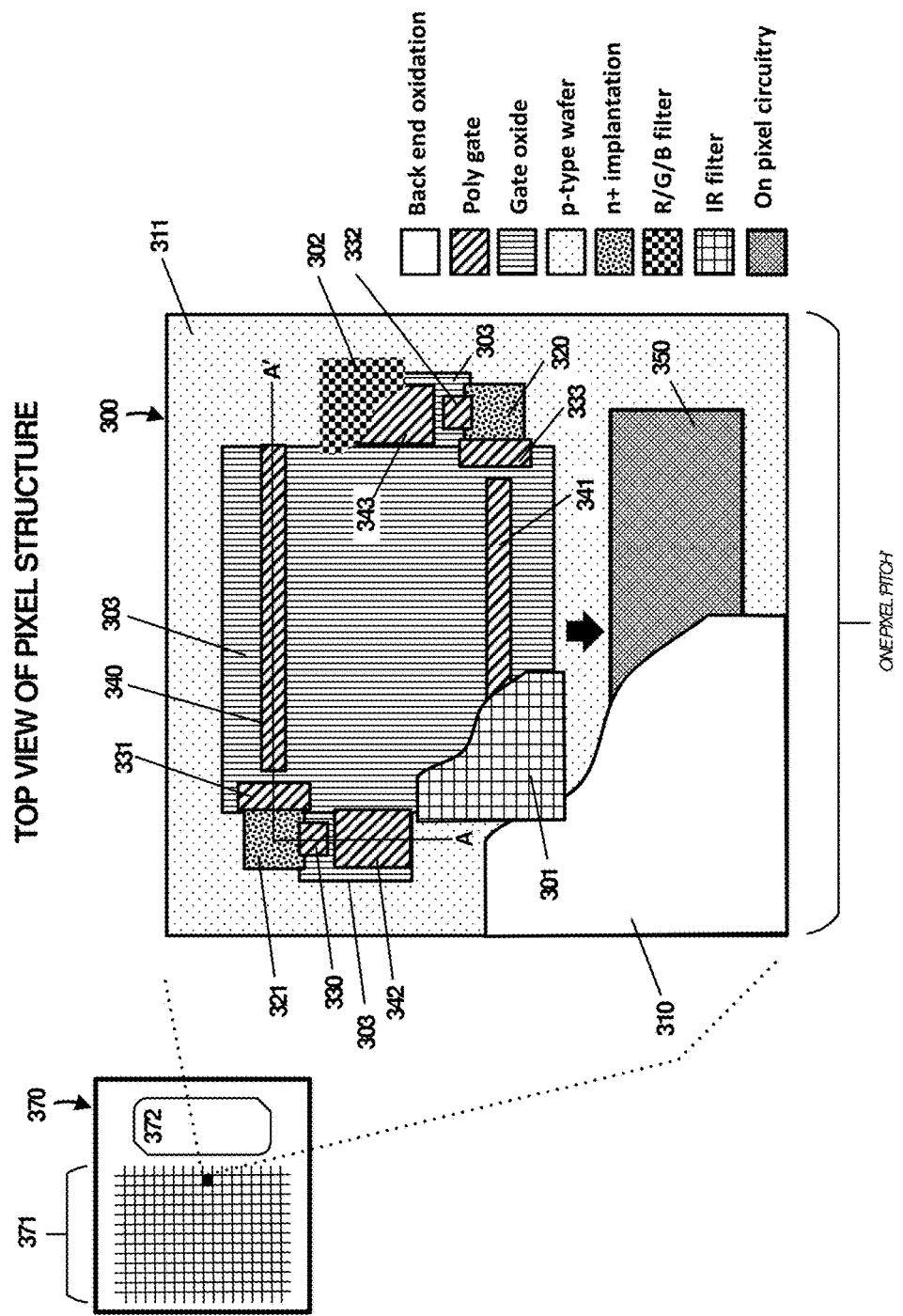
FIG. 3 illustrates a top view of a pixel structure in an implementation.

FIG. 3 illustrates a top view of pixel structure 300. Pixel structure 300 illustrates one pixel 'pitch' which includes one or more pixels configured to sense visible light nested in a pitch area of a pixel configured to sense infrared light. Pixel structure 300 can be employed in an array of pixels to form an image sensor, with a plurality of nested pixel structures forming the array. For example, imaging sensor 370 is shown in FIG. 3 which includes pixel array 371 and pixel control circuitry 372. In FIG. 3, a top view is shown of pixel structure 300, which represents a single pixel structure area of imaging sensor 370.

The pixels in pixel structure 300 are configured to sense incident light propagating to the pixel structure from the top and into the figure. This example is referred to as front side illumination (FSI). Other configurations are possible with the pixels configured to sense incident light propagating to the pixel structure from the bottom and out from the figure, referred to as back side illumination (BSI). Any associated filtering layers are positioned between light sources and the pixel, namely on the 'top' side in FSI examples, and on the back side in BSI examples.

FIG. 3 illustrates semiconductor topology for pixel structure 300. FIG. 3 also indicates a profile 'cut' along A-A' which is used in the side view illustrations in the figures below. A semiconductor substrate is employed onto which various structures are formed using various lithography fabrication processes, such as etching, deposition, masking, diffusion, ion implantations, and the like. A semiconductor wafer is typically used as the substrate, which in this example is a p-type wafer labeled as 311 in FIG. 3. Although n-type wafers can be employed, the examples herein will focus on p-type wafers for clarity.

Pixel structure 300 comprises more than one individual pixel nested within a single IR pixel pitch, with at least one of the individual pixels configured to sense IR light and at least another of the pixels configured to sense visible light. The individual pixels are each individual photodetectors, which can comprise active pixel sensor (CMOS) style pixels, photo sensitive diodes, photo gate diodes, or pined photodiodes, among other photodetectors.

Pixel structure 300 includes at least two demodulation polysilicon (poly) gates, namely gates 340 and 341, which are used in the sensing of IR light by at least creating potential wells for detecting and integrating infrared light-induced charges. Pixel structure 300 includes two poly gates, namely gates 342 and 343 used in the sensing of visible light by at least creating potential wells for detecting and integrating visible light-induced charges. Associated gate oxide region 303 is included underneath each poly gate, such as for gates 340, 341, 342, and 343, which reside on top of gate oxide region 303.

Pixel structure 300 also includes readout floating n+-diffusion on p-type silicon 320-321. During operation, charge from the pixel regions will be dumped or transferred to associated ones of floating diffusions 320-321 for readout by a shared readout circuit, shown as element 350 in FIG. 3 and highlighted in the subsequent figures. To enable both the visible light pixels and infrared light pixels to share ones of floating diffusions 320-321, charge transfer gates 330, 331, 332, and 333 are included in pixel structure 300. Transfer of infrared light-generated charges are controlled by gates 331 and 333. Transfer of visible light-generated charges are controlled by gates 330 and 332. Although two charge transfer gates per pixel pair (e.g. gates 330-331 or gates 332-333) are shown in FIG. 3, in other examples one degenerated gate is shared per pixel pair.

Also shown in FIG. 3 is IR bandpass filter 301 which filters light incident into the infrared pixel regions and acts as an IR light bandpass filter (only a corner of the rectangular filter is illustrated in the overview view). IR bandpass filter 301 can be deposited as a layer on top of pixel structure 300 during manufacturing. In FIG. 3, IR bandpass filter 301 is shown as layered on top of back end oxidation 310, and back end oxidation 310 covers the entirety of pixel structure 300. IR bandpass filter 301 can comprise a bandpass filter matched to IR light wavelengths used in active illumination of a scene, such as matched to an emissions spectrum of emitter 210 in FIG. 2.

In some examples, red/green/blue (R/G/B or RGB) filter 302 is employed over each of the visible light pixel regions. RGB filter 302 can be omitted in some examples. When used, RGB filter 302 filters light incident into the visible pixel regions and acts as a light bandpass filter for selected wavelengths of light, such as red, green, or blue. In an arrayed structure, such as an imaging sensor, the color of visible light filters can be selected to be alternating among the various pixels to provide for pixels with red filtering, pixels with green filtering, and pixels with blue filtering which can be used to produce a full-color image. In examples where specific color filtering is not desired, RGB filter 302 can be omitted and greyscale images can be produced. RGB filter 302 can be deposited as a layer on top of pixel structure 300 during manufacturing. RGB filter 302 can be applied to individual pixels to spread to cover more than one pixel, such as to have a single filtering layer cover more than one neighboring visible pixel. The IR bandpass filters and RGB filters can each be interlaced within one single 3D/2D detector pixel pitch region.

When included in array 371 that forms image sensor 370, visible pixels are interspersed with IR/TOF pixels onto a semiconductor substrate, such as a silicon wafer substrate. The visible light pixels are typically smaller in size than the IR light pixels, and can be included in the marginal area proximate to each of the IR light pixels, making for a tight packing of interspersed pixels. This interspersed arrangement uses the marginal area inside of a sensor to collect RGB or gray value information, and thus less or no additional silicon real estate is needed. The shared floating diffusion can also reduce real estate for a pixel array, even with both IR and visible light pixels. This interspersed arrangement also enhances the spatial resolution of the 3D/2D pixels.

The materials and geometries of elements of pixel structure 300 and imaging sensor 370 can vary. Various semiconductor fabrication techniques and materials are employed for the pixel structures herein. Typically, the various elements of the pixel structures comprise epitaxial layers of silicon, which can be doped or ion implanted to form various regions. Polysilicon gates are employed and can be deposited by chemical vapor deposition or patterned with photolithography and etched, among other processes. Various oxides can be grown, using thermally grown techniques or other oxide formation processes.

Figure 4:
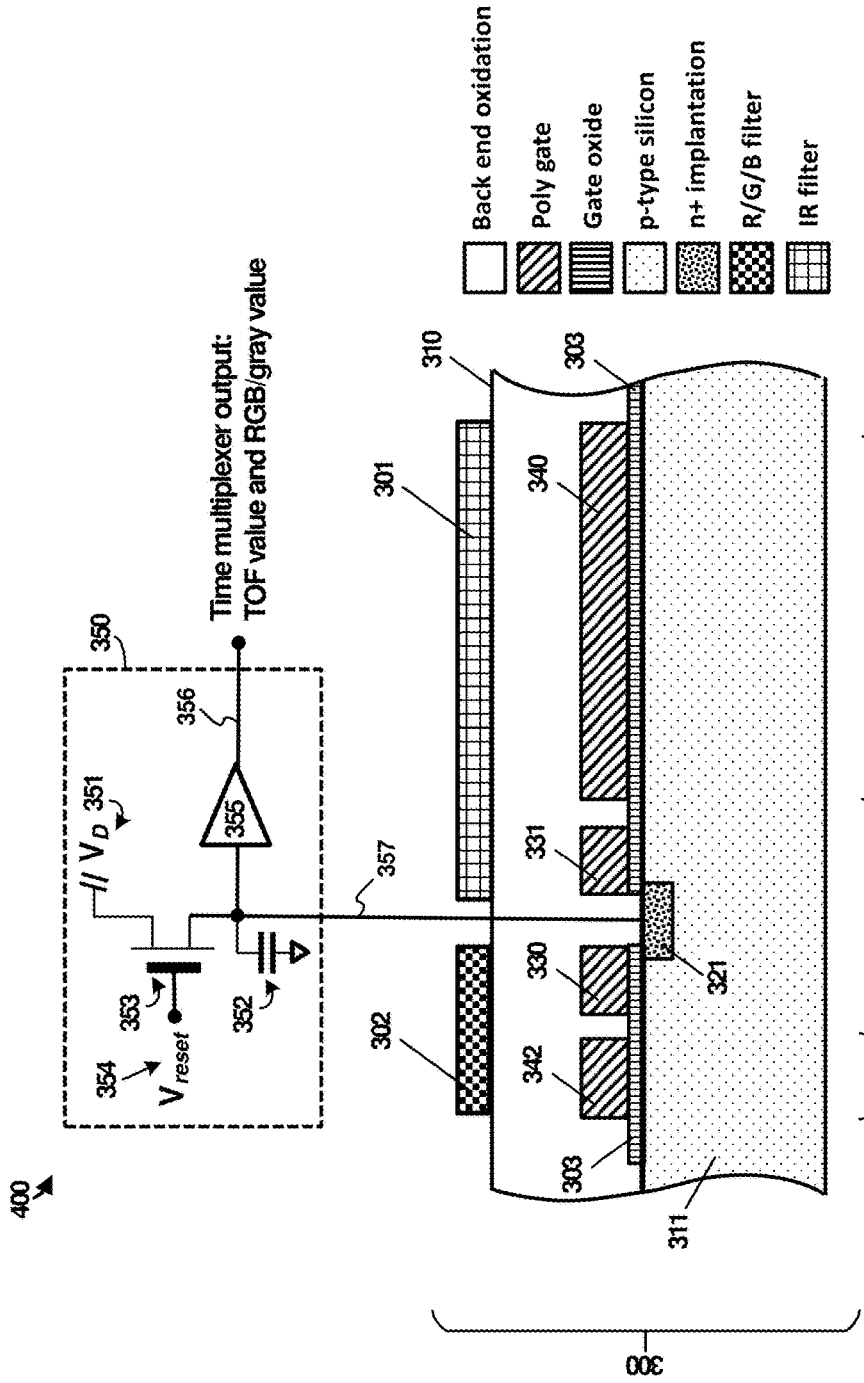
FIG. 4 illustrates a cross-sectional view of a pixel structure in an implementation.

As a further example of pixel structure 300, FIG. 4 is presented which includes a cross-sectional configuration 400 of pixel structure 300, as cut from FIG. 3 along section lines A-A'. Thus, FIG. 4 focuses on only a portion of the entire pixel structure that is shown in FIG. 3, and is labeled as pixel structure 300 for illustrative purposes in the following figures. In FIG. 4, example readout circuitry 350 is shown in more detail. Specifically, readout circuitry 350 includes reset metal-oxide semiconductor (MOS) transistor 351 with the source terminal of transistor 351 connected to positive voltage $V_D$ 351. $V_D$ can comprise a logic-level voltage which presents a reset voltage level to floating diffusion 321 (which is connected to buffer 355) when $V_{RESET}$ 354 is enabled and allows the input to floating diffusion 321 and buffer 355 to be pulled 'up' to voltage $V_D$ and register as a logic '1' by buffer 355. The input of buffer 355 is connected to the drain of MOS transistor 353. Capacitance 352 and buffer 355 covert the IR light/TOF charges and visible light charges to voltages at buffer output node 356. Each pixel capture cycle is reset by the $V_{RESET}$ which is clocked by a control circuit 212, or other control circuitry.

Figure 5:
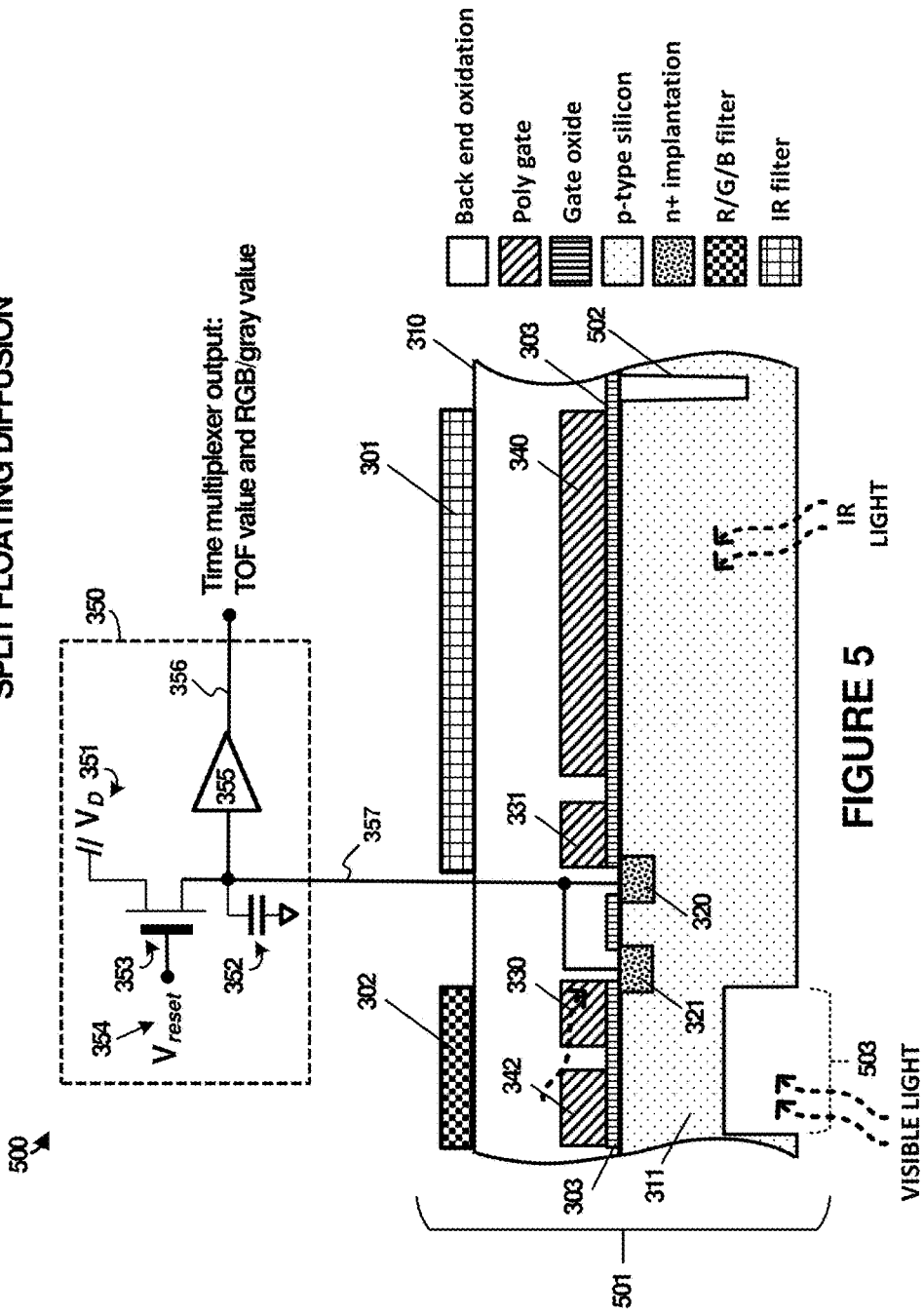
FIG. 5 illustrates a cross-sectional view of a pixel structure in an implementation.

FIG. 5 illustrates configuration 500 which includes similar features as FIG. 4, and adds detail in for three optional features—split floating diffusions, pixel separation features, and back-side cavities. Pixel structure 501 of FIG. 5 also includes similar elements as pixel structure 300, as well as the optional features discussed below.

In a first feature example, an optional split diffusion arrangement formed from floating diffusions 320-321. In this example, floating diffusions 320-321 are electrically connected, such as by metal interconnect, and thus present a common electrical potential. Floating diffusion 321 is located proximate to a first set of IR/visible light pixels, such as shown in FIG. 3 as being positioned near gate 330 and 331. Floating diffusion 320 is located proximate to a second set of IR/visible light pixels, such as shown in FIG. 3 as being positioned near gate 332 and 333. Each of the individual floating diffusions 320-321 can receive charge from the nearby pixel potential wells when the associated charge transfer gates 330, 331, 332, and 333 are enabled to allow dumping of charge onto the associated floating diffusions 320-321.

FIG. 5 also illustrates a pixel separation feature 502 to isolate adjacent pixel structures from one another and substantially reduce charge migration to adjacent pixel structures of a pixel array. This substantial reduction in charge migration can include complete prevention of charge migration, or might instead include an inhibition of charge migration or other attenuations in charge migration, where complete charge migration might not be prevented in some cases. The magnitude of charge migration inhibition can vary based on the desired performance, material properties, or induced potential well levels, among other factors. In some examples, feature 502 comprises a cavity or etched out region which physically separates pixels from neighboring pixels. In other examples, a poly gate arrangement is employed which places a separation gate similar to charge transfer gates 330, 331, 332, and 333 between each pixel, where the separation gates are configured to provide a potential barrier between neighboring pixels. In some examples, feature 502 can be omitted, when charge migration to neighboring pixels is mitigated by other features or techniques.

FIG. 5 also shows illustrates back-side cavity 503. In most of the examples herein, front side illumination (FSI) techniques are employed where light is incident from 'above' in FIG. 5. However, back side illumination (BSI) techniques can also be employed where light is incident from 'below' in FIG. 5. IR light can penetrate to an acceptable depth through p-type silicon wafer 311 in FIG. 5. However, visible light attenuates quickly in silicon wafer 311 and acceptable light levels might not reach the pixel region that captures visible light. Cavity 503 can be provided which reduces a depth or thickness of silicon wafer 311 at the visible pixel region and allows penetration of light. In some examples, silicon wafer 311 is about 7 micrometers thick, and the cavity provides a locally reduced thickness of about 3 micrometers or less. Various semiconductor fabrication techniques can be employed to form cavity 503, such as photoresist/etching techniques. It should be noted that IR bandpass filter 301 and optional RGB filter 302 would be layered onto the 'bottom' side of silicon wafer 311 in BSI examples instead of the 'top' side as shown in FIG. 5.

Figure 6:
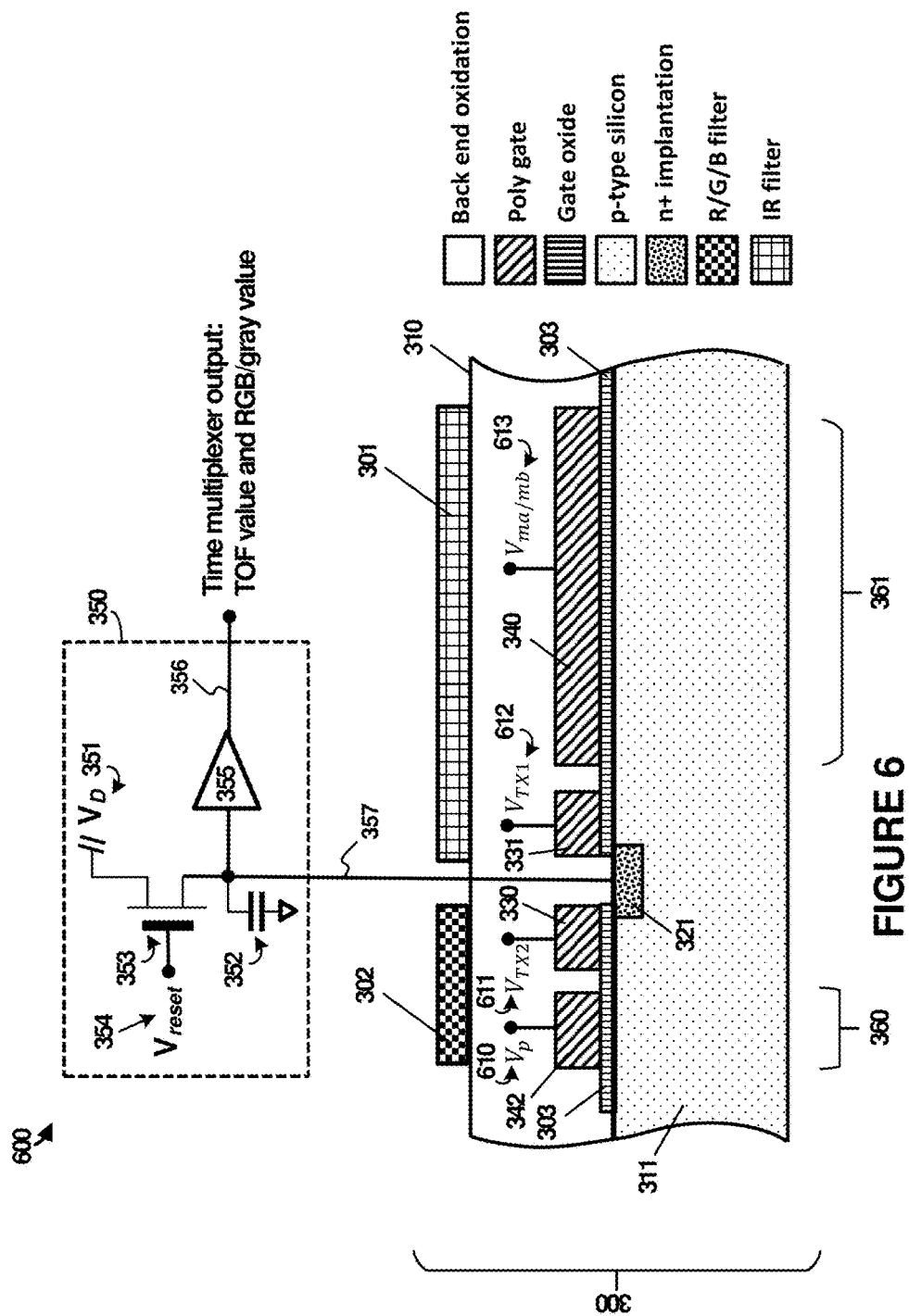
FIG. 6 illustrates a cross-sectional view of a pixel structure in an implementation.

FIG. 6 illustrates configuration 600 which includes similar features as FIG. 4, and adds detail in for electrical connections of the various elements. Specifically, FIG. 6 illustrates details of connecting to electrical sources and the timing clock diagram in FIG. 7. In the examples herein, various high/low voltage levels can be employed, which can correspond to logic-level voltages. However, for the examples in FIGS. 6-13, a low voltage is considered approximately 0.5V and a high voltage is considered approximately 2.0V. The terms 'voltage' and 'potential' can also be used interchangeably.

Turning first to the pixel elements that comprise the IR or TOF sensing portions of pixel structure 300, poly gates 340-341 (found in FIG. 3) are employed as demodulation gates to produce TOF information based on IR light and associated timing signals provided to gates 340-341. In FIG. 6, only gate 340 is shown for clarity, but gate 341 is also employed in this demodulation technique. Gate 340 is coupled to associated phase clock signal 720 at node 613. Gate 341 has a similar connection node, although not shown in FIG. 6, gate 341 is coupled to associated phase clock signal 730 at an associated node. Specifically, gate 340 is driven by signal $V_{ma}$ 720 in FIG. 7 and gate 341 is driven by signal $V_{mb}$ 730 in FIG. 7. By driving gates 340-341 in this manner, demodulation occurs which provides charge representative of a TOF signal which can be coupled to an associated floating diffusion, as will be discussed in more detail below. Charge separation/transfer gates 331 and 333 are connected to bias voltage $V_{TX1}$ 740, such as at node 612 for gate 331 in FIG. 6.

The visible sensor portion can comprise a photo diode, e.g., a photo gate diode 332, which is connected to a controlling voltage source $V_p$ at node 610. Charge separation/transfer gates 330 and 332 are connected to bias voltage $V_{TX2}$ 750, such as at node 611 for gate 330 in FIG. 6. Both the IR light pixel structure and the visible light pixel structure share the same output floating diffusion 321 and the same readout circuitry 350.

As mentioned above, FIG. 7 is a timing diagram which illustrates signaling employed to drive pixel structure 300, among other pixel structures found herein. To perform the TOF sensing and visible light sensing concurrently, pixel structure 300 is operated by the timing diagram in FIG. 7. The timing diagram is characterized with five (5) operational stages within one image capture cycle, which are related to pixel structure 300 operation explained below. Operational stages I-V complete one cycle of visible light and IR light detection/sensing processes all in one pixel structure. In typical examples, an array comprised of the pixels perform 3D/2D measurements with independent responses to active IR illumination and passive visible light at different optical spectra domains.

Figure 7:
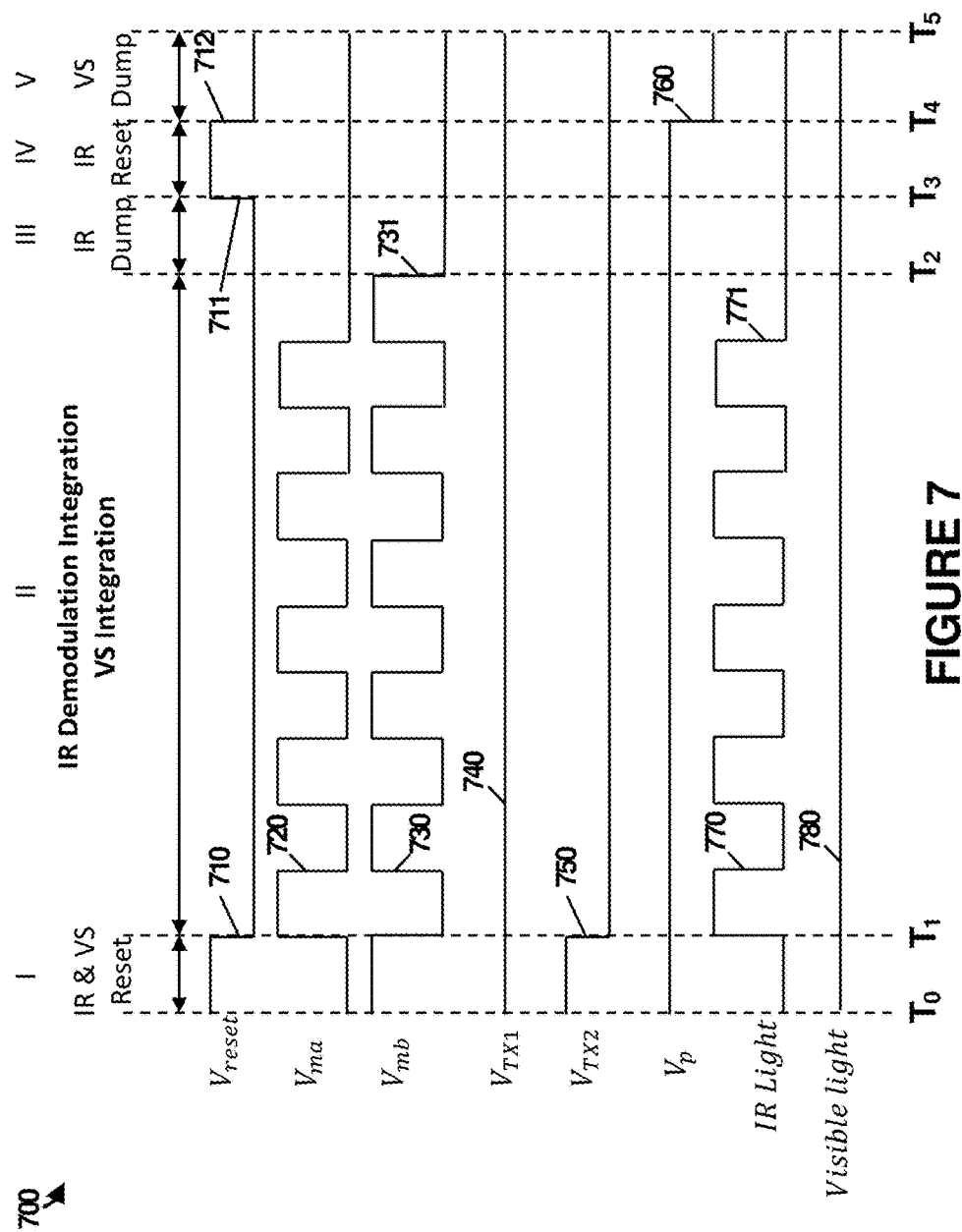
FIG. 7 illustrates a timing diagram for an imaging sensor in an implementation.
Figure 8:
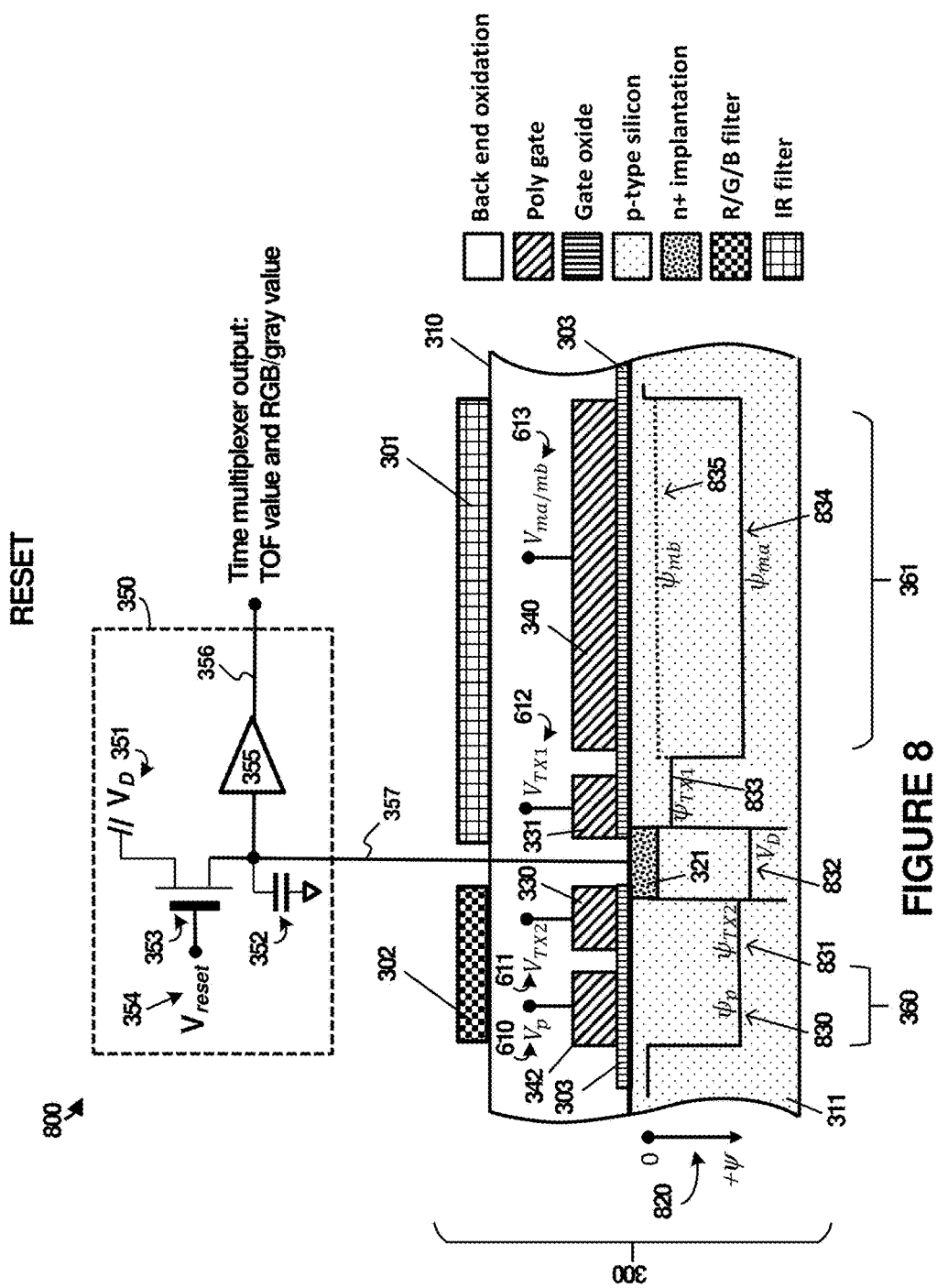
FIG. 8 illustrates a cross-sectional view of a pixel structure in an implementation.

FIG. 8 illustrates a reset process 800 for pixel structure 300. Stage I of FIG. 7 corresponds to reset process 800 in FIG. 8. Both IR and visible light pixel charges are reset in operational stage I, which in FIG. 7 occurs between time $T_0$ and $T_1$. The surface potential well configuration underneath all the poly gates is shown in FIG. 8, which sets up a free charge channel path performing the reset process. The polarity of each potential well is indicated with potential gauge 820 which indicates relative potentials from 0 to $+\Psi$. It should be noted that the surface potential is denoted by $\Psi$ which is typically not equal to a voltage applied to a corresponding gate due to 'flat band' conditions found in typical MOS structures.

When $V_{reset}$ of the MOS transistor gate is held at a high potential, both visible light generated charges and IR light generated charges will be drained away to the voltage source $V_D$ 351, thus resetting the floating diffusion 321 to the voltage $V_D$. During the reset process, the TOF demodulation clock provided by $V_{ma}$ 720 and $V_{mb}$ 730 can be activated or instead be set to the same level. The timing diagram in FIG. 7 shows a one clock cycle reset process, although the reset process can occur for any longer amount of time.

To allow visible light generated charges and IR light generated charges to be drained from floating diffusion 321 to the voltage $V_D$, transfer gates 330 and 331 can both be enabled which allows charge in each pixel region to be dumped onto floating diffusion 321. In some examples, transfer gates 330 and 331 are both enabled, while in other examples, transfer gates 330 and 331 are alternatingly enabled. For visible light generated charges, FIG. 8 shows transfer gate 330 as enabled, as noted in $V_{TX2}$ 740 in FIG. 7, which brings potential underneath gate 330 to potential $\Psi_{TX2}$ 831, which is similar in potential to $\Psi_P$ 830 established by $V_p$ 760 underneath gate 332. This configuration drains charge from below gate 332 to floating diffusion 321 and resets the visible pixel region. To reset the IR pixel region underneath gate 340, a similar process is followed but instead transfer gate 331 is enabled which brings potential $\Psi_{TX2}$ 831 underneath gate 331 to a similar potential as $\Psi_{ma}$ 834 established by $V_{ma}$ 720 underneath gate 340. This configuration drains charge from below gate 340 to floating diffusion 321 and resets the infrared pixel region. A similar process can be followed for regions underneath gates 341 and 343 which have a similar operation but share a different transfer gate 320.

It should be noted that potential $\Psi_{ma}$ 835 is shown in FIGS. 8-13 to illustrate potential/voltage associated with gate 341. Gate 341 is controlled by signal $V_{mb}$ 730 in FIG. 7. When gate 340 and gate 341 are driven to opposite potentials as seen in FIG. 7, demodulation of charges generated by modulated IR light is performed.

Figure 9:
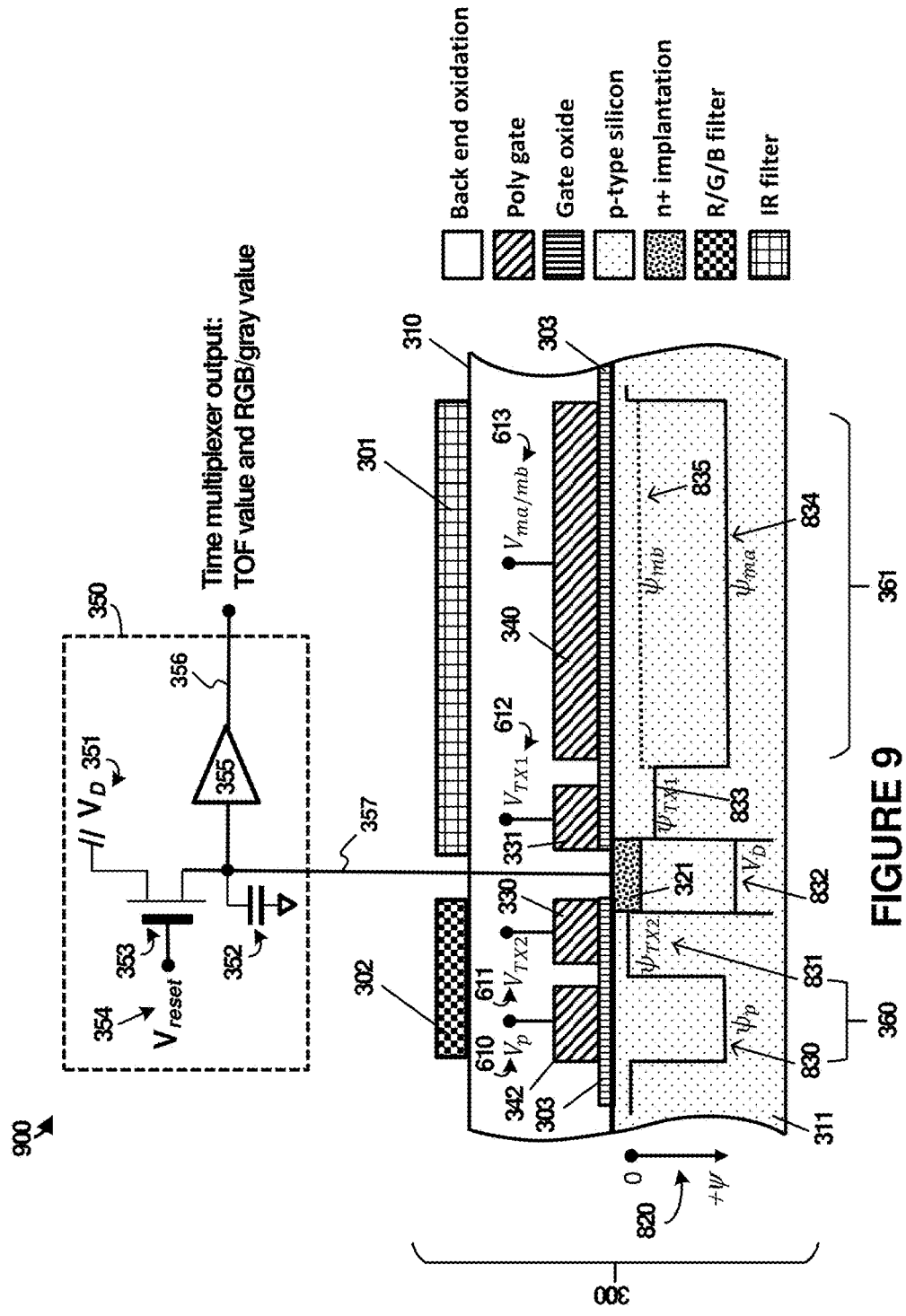
FIG. 9 illustrates a cross-sectional view of a pixel structure in an implementation.

FIG. 9 illustrates configuration 900 which includes pixel structure 300 ready to receiving light after a reset process.

FIG. 9 illustrates the operational stages at time $T_1$ in FIG. 7. In FIG. 9, both transfer gates 330-331 are disabled which inhibit any light generated charges accumulated in potential wells underneath gates 332 and 340 from transferring or dumping onto floating diffusion 321. Specifically, FIG. 9 shows potential $\Psi_{TX2}$ 831 and $\Psi_{TX1}$ 833 as creating potential barriers which inhibits charge propagation from the associated potential wells $\Psi_P$ 830 and $\Psi_{ma}$ 834 to floating diffusion 321.

Figure 10:
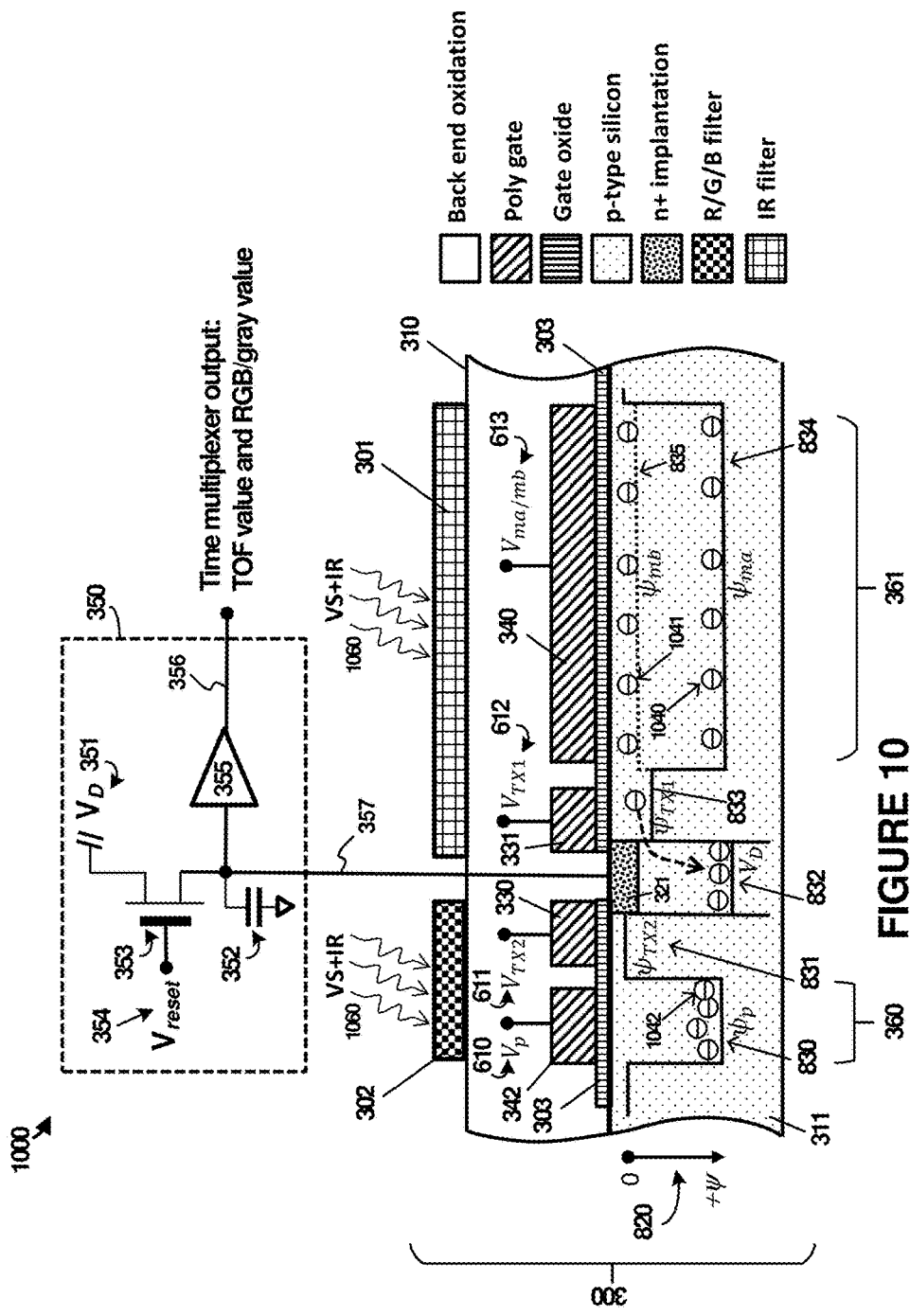
FIG. 10 illustrates a cross-sectional view of a pixel structure in an implementation.

FIG. 10 illustrates configuration 1000 which shows pixel structure 300 detecting light by visible light pixel 360 and IR light pixel 361. FIG. 10 corresponds to operational stage II in FIG. 7, between times $T_1$ and $T_2$. In FIG. 10, both visible light and infrared light (VS+IR) 1060 are received into both pixels at the same time. IR light is emitted from an emitter device, not shown in FIG. 10, but can be similar to that seen in FIGS. 1 and 2, which illuminates a scene and objects within the scene. Ambient light and active light sources can also provide visible light. RGB filter 302 is positioned over visible light pixel 360 and IR bandpass filter 301 is positioned over IR light pixel 361. These filters act as bandpass filters which allow selected wavelengths of light to pass while blocking/absorbing unwanted wavelengths. Thus, IR bandpass filter 301 allows IR wavelengths to pass, while blocking visible wavelengths. Conversely, RGB filter 302 (if applied) allows selected red, green, or blue visible wavelengths to pass, while blocking IR wavelengths. If RGB filter 302 is not applied, the sensor delivers a gray value. This light, after selective filtering, reaches the potential wells created for pixel 360 and pixel 361.

After completion of the reset process for IR charges, the voltage $V_{TX2}$ 611 is applied to gate 330 is set to low voltage, as seen in FIG. 7 $V_{TX2}$ 750. The surface potential $\Psi_{TX2}$ 831 underneath the gate is lower than $\Psi_P$ 830 which acts as a 'valve' and closes the passage for the visible light-generated charge to reach at floating diffusion 321. Therefore visible light-generated charge 1042 is isolated and resided in the potential well $\Psi_P$ 830 underneath the photo gate 332 by keeping the gate voltage $V_p$ 610 high. On the other side of the pixel structure, for pixel 361, IR generated charges 1040 and 1041 are in associated potential wells $\Psi_{ma}$ 834, $\Psi_{mb}$ 835 induced by clock signals $V_{ma}$, $V_{mb}$ 613 (i.e. 720 and 730 in FIG. 7) are continuously demodulated and transferred to floating diffusion 321 via a channel under transfer gate 331 with potential $\Psi_{TX1}$ 833 under a gate bias condition $V_{TX1}$ 612. The pixel structure detects the visible signal and TOF signal and integrates the photo charges concurrently; the visible light generated charges are storage underneath the gate 332, while the IR generated charges underneath gate 340 are ready to be dumped from floating diffusion 321.

Figure 11:
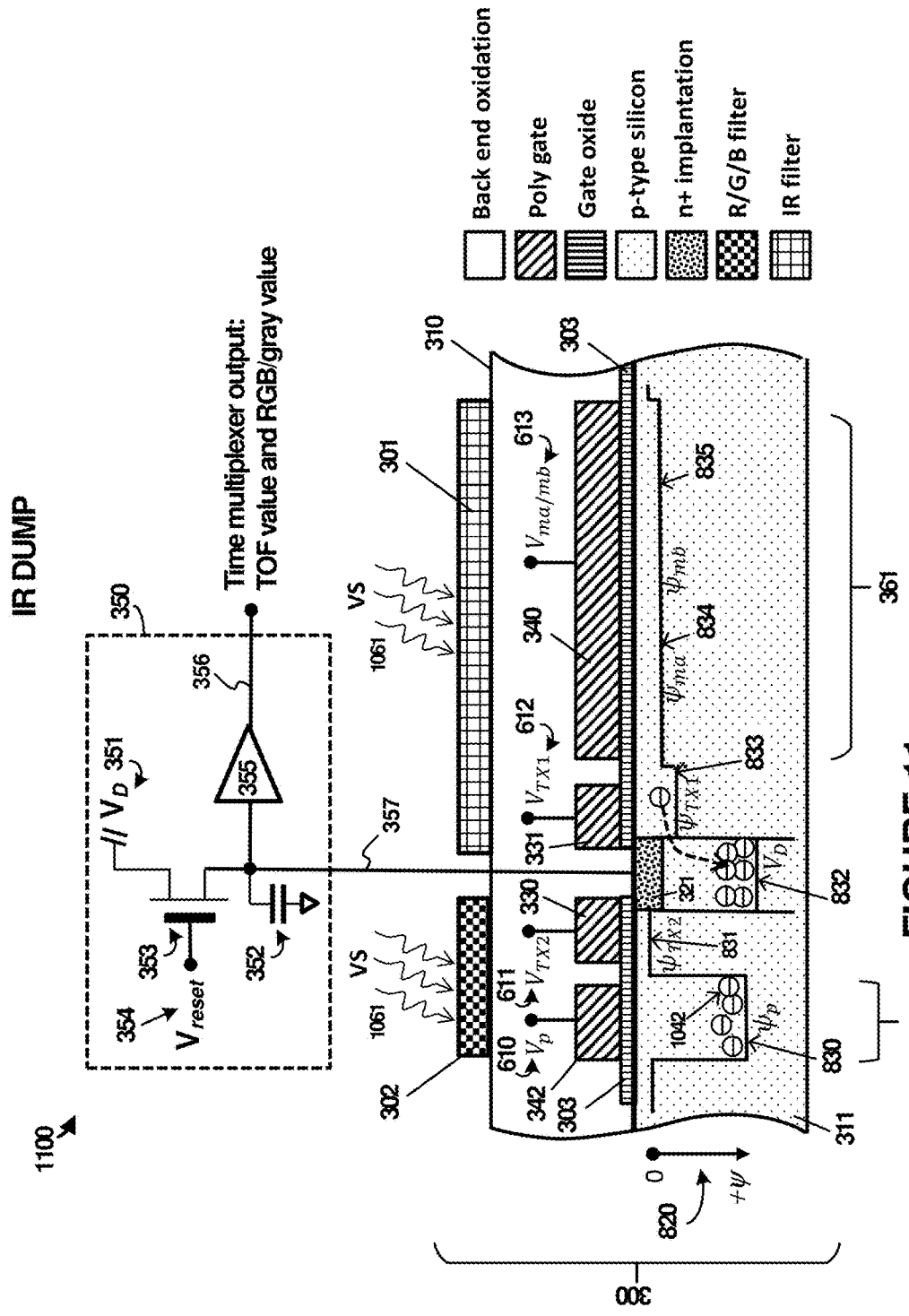
FIG. 11 illustrates a cross-sectional view of a pixel structure in an implementation.

FIG. 11 illustrates the IR dump and IR readout processes. This process is indicated in FIG. 7 as operational stage III between times $T_2$ and $T_3$. Demodulation clock voltage signals $V_{ma}$ 720 and $V_{mb}$ 730 are held low in operational stage III. The charges in potential wells $\Psi_{ma}$ 834 and $\Psi_{mb}$ 835 will be dumped over to floating diffusion 321, which is converted to voltage by the readout unit 350 to a corresponding voltage value at output terminal 356. Any active IR light can then be disabled to save power after this stage completes.

Figure 12:
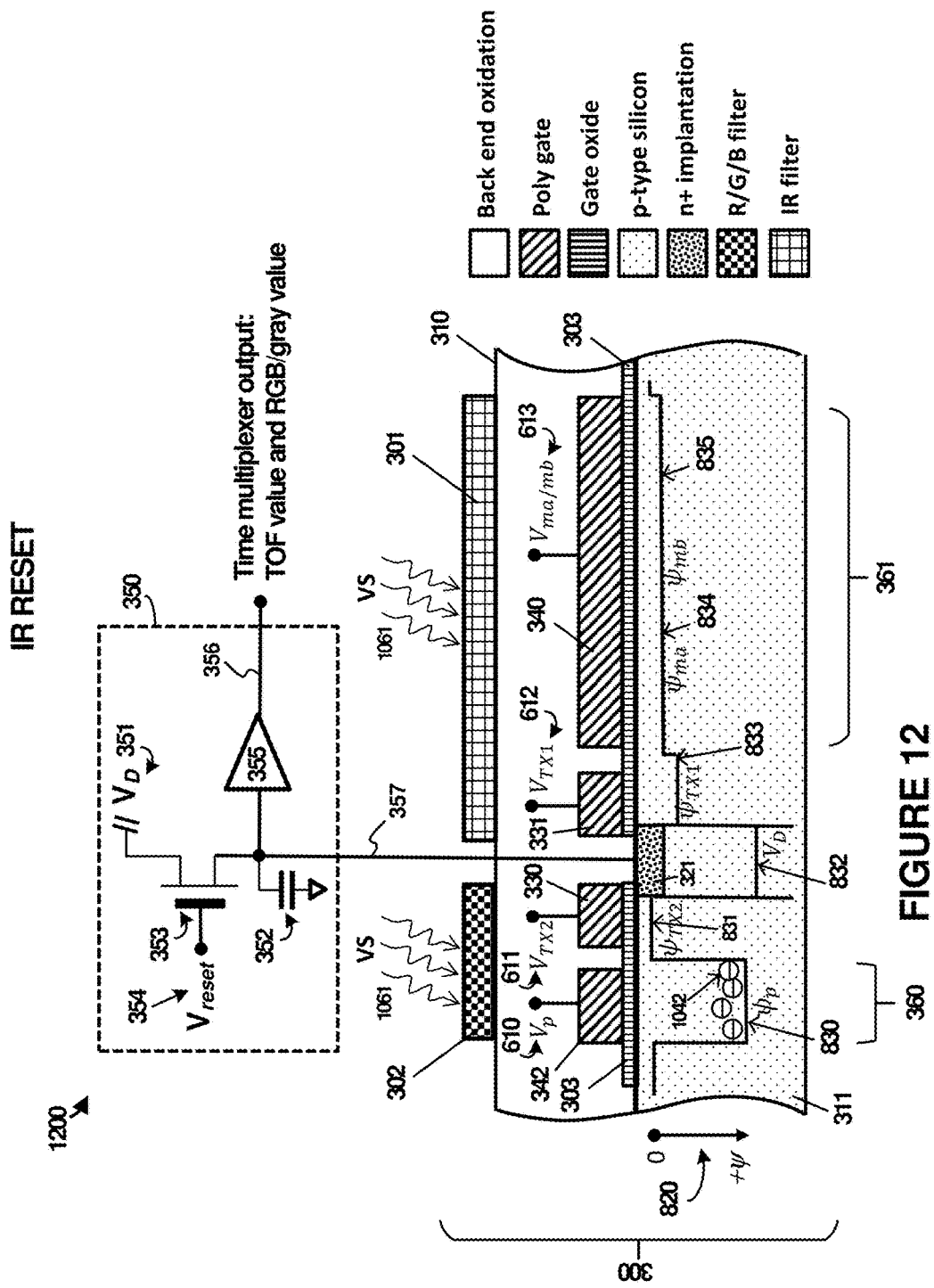
FIG. 12 illustrates a cross-sectional view of a pixel structure in an implementation.

FIG. 12 illustrates the IR reset process. This process is indicated in FIG. 7 as operational stage IV between times $T_3$ and $T_4$. After the IR dump and IR readout of the previous stage, IR charges 1040 and 1041 (FIG. 10) are reset by switching on MOS transistor 353, referred to in FIG. 7 for $V_{reset}$ 710. Floating diffusion 321 is reset to the voltage value $V_D$ 351, creating the potential well configuration shown in FIG. 12 at location 832. Meanwhile, the visible light-generated charges 1042 are still isolated and remain in potential well $\Psi_P$ 830 ready to be dumped and read out.

Figure 13:
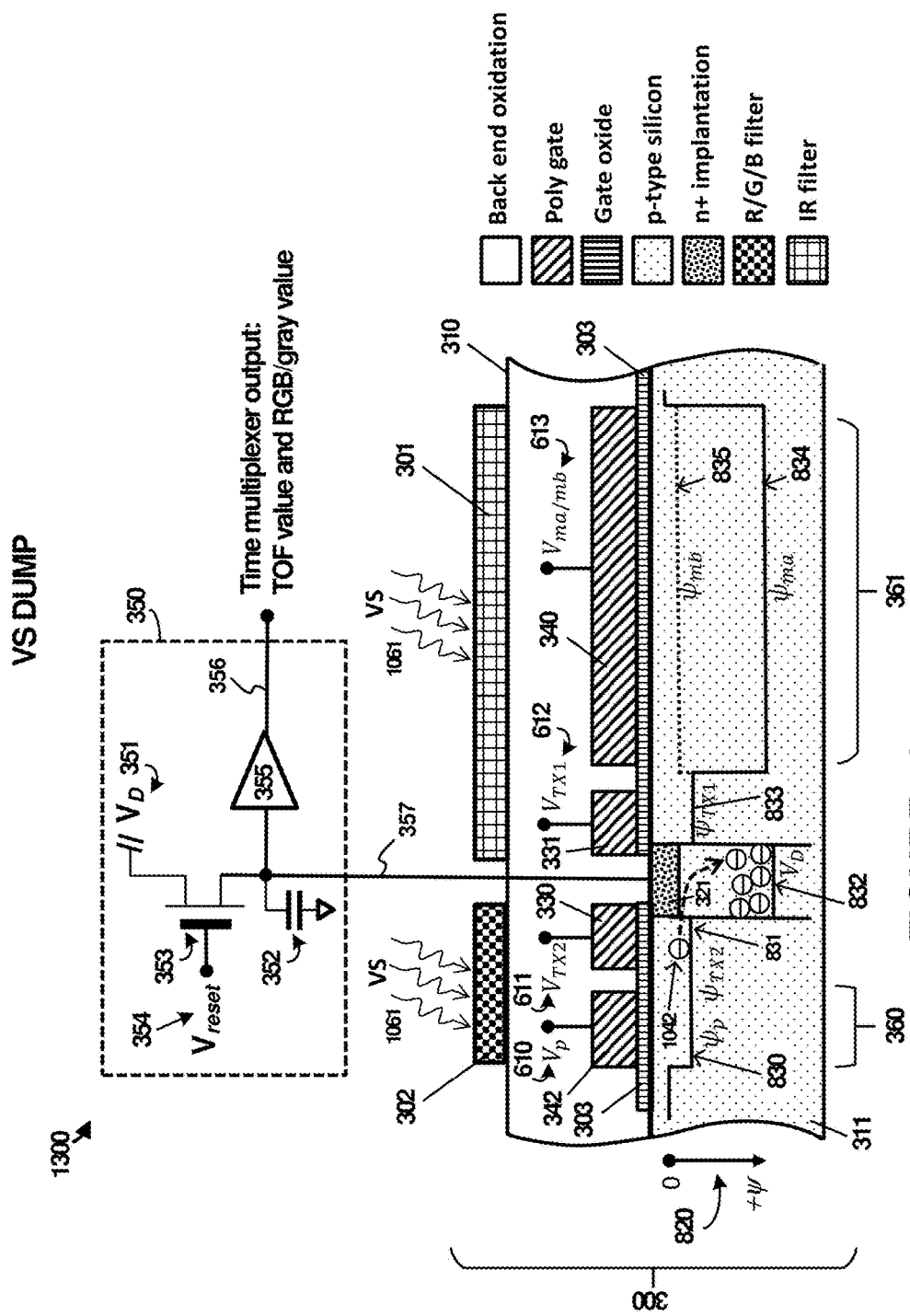
FIG. 13 illustrates a cross-sectional view of a pixel structure in an implementation.

FIG. 13 illustrates the VS (visible) dump and VS readout process. This process is indicated in FIG. 7 as operational stage V between times $T_4$ and $T_5$. Photo gate voltage $V_p$ 610 (760) is clocked to a lower voltage level, e.g. $V_p \leq V_{TX2}$, and the corresponding potential well $\Psi_P$ 830 dumps visible light charges 1042 to floating diffusion 321 via channel with potential $\Psi_{TX2}$ 831 induced under transfer gate 330 by $V_{TX2}$ 611. The visible light-generated charge is then converted by the same readout unit 350 to a corresponding voltage value at output terminal 356.

The operations of FIG. 7 can then be repeated for continued detection and readout of visible and IR light. Advantageously, each pixel 360-361 detects associated light simultaneously and thus any movement in objects in the scene, movement of the imaging sensor, or changes in aspect of the imaging sensor are do not result in temporal image artifacts between 3D depth images and 2D images. The IR light-generated charge is read out as a corresponding voltage while the visible light-generated charge waits in a potential well to be later dumped off to floating diffusion 321 using transfer gate 330 as a charge valve. This has the technical effect of reducing the number of components for an imaging sensor and associated pixels. Also, the technical effect of reduced power consumption is achieved.

The examples herein provide for a single combined pixel architecture with both 3D (IR, TOF) and 2D (RGB or BW). This pixel arrangement is formed on a semiconductor substrate, and comprises a first pixel configured to sense infrared light, a second pixel configured to sense visible light, and an output element shared by the first pixel and the second pixel, where a first output state of the output element presents a first signal corresponding to detected infrared light of the first pixel and a second output state presents a second signal corresponding to detected visible light of the second pixel.

When included in an array that forms an image sensor, visible pixels are interspersed with IR/TOF pixels onto semiconductor substrate, such as a silicon wafer substrate. The visible light pixels are typically smaller in size than the IR light pixels, and can be included in the marginal area proximate to each of the IR light pixels, making for a tight packing of interspersed pixels. This interspersed arrangement uses the marginal area inside of a TOF sensor to collect RGB or gray value information, and thus less additional silicon real estate needed. The shared floating diffusions can also reduce real estate for a pixel array, even with both IR and visible light pixels. The IR bandpass filters and RGB filters can each be interlaced within one single 3D/2D detector pixel pitch region. This interspersed arrangement also enhances the spatial resolution of the 3D/2D pixels.

It should be noted that the shared floating diffusion with transfer gates architecture discussed herein can be applied to imaging sensors that employ other types of pixels. For example, if the imaging sensor does not include IR light pixels, then pairs of visible light pixels can share the same readout structure (i.e. a shared floating diffusion with the transfer gates). Likewise, if the imaging sensor does not include visible light pixels, then pairs of IR light pixels can share the same readout structure.

Figure 14:
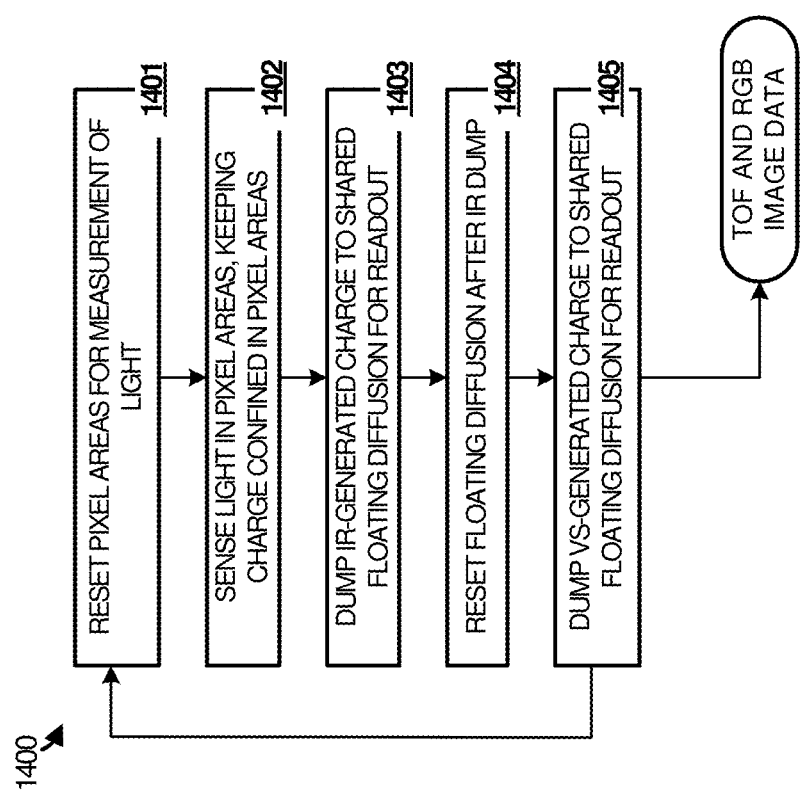
FIG. 14 illustrates a method of operating an imaging sensor in an implementation.

FIG. 14 is provided to provide an additional example method 1400 for operation of a pixel structure or pixel array. The operations of method 1400 can include similar processes as found in the discussion surrounding FIG. 7, although variations are possible. The operations of FIG. 14 are also discussed in the context of pixel control circuitry 372 and pixel structure 300 of FIG. 3. However, the operations of FIG. 14 can be executed by any control module employed herein for control of other pixel structures or pixel arrays, such as TOF processing circuitry 122 of FIG. 1, controller 212 of FIG. 2, pixel control circuitry 372 of FIG. 3, and computing system 1501 in FIG. 15.

In FIG. 14, circuitry 372 resets (1401) pixel areas for measurement of light. In FIG. 8, $V_{reset}$ is enabled which turns on transistor 353 and pulls node 357 to $V_D$. Floating diffusion 321 is then pulled 'high' to $V_D$ and any charge remaining on floating diffusion 321 is drained to $V_D$. Pixel structure 300 senses (1402) light in pixel areas 360-361, keeping charge confined in pixel areas 360-361. Transfer gates 330-331 held to a low potential voltage during the period of light collection to act as barriers to charge movement to shared floating diffusion 321, and any accumulated charge is held in associated potential wells $\Psi_p$ 830 and $\Psi_{ma}$ 834 by created by gates 342 and 340. Pixel structure 300 first dumps (1402) IR-generated charge to shared floating diffusion 321 for readout by readout circuit 350. Gate 340 is brought to a low potential, which creates a channel for charge accumulated in pixel 361 to flow to shared floating diffusion 321, which is converted into a voltage by buffer 355 for readout on node 356. Circuitry 372 resets (1403) shared floating diffusion 321 after IR light-generated charges are dumped and read out. $V_{reset}$ is enabled which turns on transistor 353 and pulls node 357 to $V_D$. Floating diffusion 321 is then pulled 'high' to $V_D$ and any charge remaining on floating diffusion 321 is drained to $V_D$. Pixel structure 300 then dumps (1404) visible (VS) light-generated charge to shared floating diffusion 321 for readout by readout circuit 350. Gate 342 is brought to a low potential, which creates a channel for charge accumulated in pixel 360 to flow to shared floating diffusion 321, which is converted into a voltage by buffer 355 for readout on node 356. The operations in method 1400 can be repeated as necessary to detect and sense TOF/RGB data in a cyclical fashion, or to provide for further imaging processes.

Thus, IR pixel 361 is read out first, and VS pixel 360 is read out second, creating a time-multiplexed readout operation for pixel structure 300. It should be noted that although the IR pixel is read out first in the above examples, other examples can have the VS pixel read out first. Once the pixel voltages are presented on output node 356, these voltages are transferred to an image processing circuit for conversion into an image and into TOF data, such as a depth map image. Typically, an array of pixels will be employed, and the pixel array will be read out using the time-multiplexed IR/RGB process for each pixel structure. A 3D image can be formed based on the TOF information measured using the IR pixel data and a 2D image can be formed based on the RGB pixel data (or greyscale if applicable).

FIG. 15 illustrates controller 1500 that is representative of any system or collection of systems in which the various time-of-flight detection, pixel control, pixel timing, and image processing operational architectures, scenarios, and processes disclosed herein may be implemented. For example, controller 1500 can be employed in TOF processing circuitry 122 of FIG. 1, controller 212 of FIG. 2, or pixel control circuitry 372 of FIG. 3. Examples of controller 1500 can be incorporated into further devices and systems, such as virtual reality devices, augmented reality devices, gaming machines, camera devices, TOF cameras, smart phones, laptop computers, tablet computers, desktop computers, servers, cloud computing platforms, hybrid computers, virtual machines, smart televisions, smart watches and other wearable devices, as well as any variation or combination thereof.

Controller 1500 may be implemented as a single apparatus, system, or device or may be implemented in a distributed manner as multiple apparatuses, systems, or devices. For example, controller 1500 can comprise one or more application-specific integrated circuits (ASICs), field-programmable gate arrays (FPGA), or discrete logic and associated circuitry, including combinations thereof. Although not shown in FIG. 15, controller 1500 can include communication interfaces, network interfaces, user interfaces, and other elements for communicating with a host system over communication link 1520. Computing system 1501 may optionally include additional devices, features, or functionality not discussed for purposes of brevity.

Controller 1500 can also comprise one or more microcontrollers or microprocessors with software or firmware included on computer-readable storage media devices. If software or firmware is employed, the computer-readable storage media devices may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal.

Controller 1500 includes various controller portions to enhance time-of-flight sensing, namely emitter controller 1510, pixel array controller 1511, and optional image processor 1512. Emitter controller 1510 provides timing of emission of IR light to be synchronized with measurement of IR light by IR pixels, and typically operates in conjunction with pixel array controller 1511. In some examples, emitter controller 1510 provides RF modulator control signaling to indicate an RF modulation frequency and phase to RF modulator circuitry and to pixel array controller 1511. Pixel array controller 1511 provides pixel control signaling to control the pixel structures discussed herein, whether the pixels are individual pixels or included in an array of pixels. Specifically, pixel array controller 1511 provides for resetting IR pixel areas for measurement of light, controlling transfer gates to transfer charge to shared floating diffusions, and time multiplexing readout of IR/VS pixels, among other operations. Pixel array controller 1511 provides for receiving pixel readout and providing pixel readout information to optional image processor 1512. Image processor 1512 provides for accumulating pixel data for an array of pixels to create 3D and 2D images and providing associated TOF information or 3D/2D image data to a host system over communication link 1520. Image processor 1512 also processes TOF information generated by IR pixels and RGB/greyscale information generated by VS pixels to form 3D digital images, such as depth map digital images, and form 2D digital images, such as visual light images, among other operations. When image processor 1512 is omitted, pixel array controller 1511 can provide pixel readout data to a host system over communication link 1520. In some examples, pixel array controller 1511 controls or includes an analog-to-digital conversion circuit to convert pixel readout signals to digital formats.

Certain inventive aspects may be appreciated from the foregoing disclosure, of which the following are various examples.

Example 1

An imaging sensor, comprising a semiconductor substrate comprising an array of pixel structures for concurrently sensing infrared light and visible light, each of the pixel structures comprising a first pixel element configured to detect the infrared light and a second pixel element configured to detect the visible light, each of the pixel structures further comprising a shared output circuit that couples the first pixel element and the second pixel element such that a first output state presents a first signal corresponding to detected infrared light of the first pixel element and a second output state presents a second signal corresponding to detected visible light of the second pixel element.

Example 2

The sensor of Example 1, comprising the shared output circuit of each of the pixel structures comprising a floating diffusion element configured to receive charge from the first pixel element or the second pixel element based at least on a selection state of the shared output circuit.

Example 3

The sensor of Examples 1-2, comprising based at least on the shared output circuit being in the first output state, a readout circuit communicatively coupled to the floating diffusion element is configured to dump first charge representative of the detected infrared light to the floating diffusion element and convert the first charge to a first voltage. Based at least on the shared output circuit being in the second output state, the readout circuit is configured to dump second charge representative of the detected visible light to the floating diffusion element and convert the second charge to a second voltage.

Example 4

The sensor of Examples 1-3, comprising based at least on the shared output circuit being in the first output state, the charge representative of the detected visible light is inhibited from dumping to the floating diffusion element by a first potential barrier proximate to the first pixel element that is established by the shared output circuit. Based at least on the shared output circuit being in the second output state, the charge representative of the detected infrared light is inhibited from dumping to the floating diffusion element by a second potential barrier proximate to the second pixel element that is established by the shared output circuit.

Example 5

The sensor of Examples 1-4, comprising the shared output circuit of each of the pixel structures comprises a first transfer element configured to create a potential barrier proximate to the first pixel element and inhibit dumping of charge to the floating diffusion element from the first pixel element when the shared output circuit is in the second output state. The shared output circuit comprises a second transfer element configured to create a potential barrier proximate to the second pixel element and inhibit dumping of charge to the floating diffusion element from the second pixel element when the shared output circuit is in the first output state.

Example 6

The sensor of Examples 1-5, comprising for each of the pixel structures, the first pixel element configured to detect the infrared light and hold charge representative of the detected infrared light until the first output state, and the second pixel element configured to detect the visible light concurrent with the first pixel element detecting the infrared light and hold charge representative of the detected visible light until the second output state.

Example 7

The sensor of Examples 1-6, comprising for each of the pixel structures, the first pixel element having an infrared light bandpass filter, and the second pixel element having at least one of a red, green, or blue light bandpass filter.

Example 8

The sensor of Examples 1-7, comprising each of the pixel structures comprising the second pixel element positioned in a marginal area proximate to the first pixel element on the semiconductor substrate.

Example 9

The sensor of Examples 1-8, comprising for each of the pixel structures, the first pixel element configured to detect the infrared light through the semiconductor substrate, and the second pixel element configured to detect the visible light through a cavity in the semiconductor substrate that reduces a depth of the semiconductor substrate through which the visible light travels to reach the second pixel element

Example 10

A time-of-flight (TOF) sensor apparatus, comprising an emitter configured to emit infrared light onto a scene for detection by an imaging sensor. The imaging sensor comprising an array of pixels for concurrently sensing depth values for the scene and visible light intensity for the scene, with sets of the pixels of the imaging sensor each having a shared floating diffusion element in an output circuit configured to multiplex pixel output among the pixels of the associated set. A processing circuit configured to process at least the pixel output for each of the sets of the pixels to provide image data indicating the depth values of the scene and the visible light intensity of the scene.

Example 11

The sensor apparatus of Example 10, comprising the output circuit of each of the sets comprising the shared floating diffusion element configured to receive first charge from at least a first pixel representative of the infrared light detected by at least the first pixel and receive second charge from at least a second pixel representative of the visible light detected by at least the second pixel.

Example 12

The sensor apparatus of Examples 10-11, comprising the output circuit of each of the sets comprising a first transfer gate that when in a first output mode, is configured to allow the first charge to be transferred to the shared floating diffusion element, and when in a second output mode is configured to inhibit the first charge from being transferred to the shared floating diffusion element. The output circuit of each of the sets comprising a second transfer gate that when in the second output mode, is configured to allow the second charge to be transferred to the shared floating diffusion element, and when in the first output mode is configured to inhibit the second charge from being transferred to the shared floating diffusion element.

Example 13

The sensor apparatus of Examples 10-12, wherein the first output mode comprises the first transfer gate at a first potential level, the second transfer gate at the first potential level, a gate of at least an associated infrared light pixel at the first potential level, and the shared floating diffusion element having been reset to a second potential level higher than the first potential level, and wherein the first output mode comprises the first transfer gate at a first potential level, the second transfer gate at the first potential level, a gate of at least an associated visible light pixel at the first potential level, and the shared floating diffusion element having been reset to the second potential level.

Example 14

The sensor apparatus of Examples 10-13, comprising ones of the pixels for sensing the depth values comprising infrared light bandpass filter elements, and ones of the pixels for sensing the visible light intensity comprising at least one of red, green, or blue light bandpass filter elements.

Example 15

The sensor apparatus of Examples 10-14, comprising ones of the pixels for sensing the depth values interspersed with ones of the pixels for sensing the visible light intensity, with the ones of the pixels for sensing the visible light intensity nested within marginal areas of associated ones of the pixels for sensing the depth values.

Example 16

A method of operating a pixel arrangement formed on a semiconductor substrate, the method comprising receiving first light in a first pixel, and receiving second light in a second pixel concurrent with the first pixel receiving the first light. The method includes in a first output state, transferring first light-generated charge from the first pixel to a shared floating diffusion element for readout as a first voltage level, and in a second output state, transferring second light-generated charge from the second pixel to the shared floating diffusion element for readout as a second voltage level.

Example 17

The method of Example 16, further comprising in the first output state, inhibiting transfer of the second light-generated charge from the second pixel to the shared floating diffusion element.

Example 18

The method of Examples 16-17, further comprising resetting the shared floating diffusion element after readout of the first light-generated charge from the first pixel, and resetting the shared floating diffusion element after readout of the second light-generated charge from the second pixel.

Example 19

The method of Examples 16-18, wherein the shared floating diffusion element comprises a floating diffusion region of the semiconductor substrate configured to receive charges from the first pixel or the second pixel based at least on potentials formed by transfer gates associated with each of the first pixel and the second pixel.

Example 20

The method of Examples 16-19, further comprising in the first output state, inhibiting transfer of the second light-generated charge from the second pixel to the floating diffusion region using at least a first potential barrier formed by at least a first of the transfer gates associated with the second pixel, and in the second output state, inhibiting transfer of the first light-generated charge from the first pixel to the floating diffusion region using at least a second potential barrier formed by at least a second of the transfer gates associated with the first pixel.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

What is claimed is:

1. An imaging sensor, comprising:
    a semiconductor substrate comprising an array of pixel structures for concurrently sensing infrared light and visible light;
    each of the pixel structures comprising:
        a first pixel element configured to detect the infrared light and hold charge representative of the detected infrared light;
        a second pixel element configured to detect the visible light concurrent with the first pixel element detecting the infrared light and hold charge representative of the detected visible light; and
        a shared output circuit that couples the first pixel element and the second pixel element and is configured to inhibit transfer of the charge from the first pixel element with at least first potential barrier until a first output state, and inhibit transfer of the charge from the second pixel element with at least a second potential barrier until a second output state.

2. The imaging sensor of claim 1, comprising:
    the shared output circuit of each of the pixel structures comprising a floating diffusion element configured to receive associated charge from the first pixel element or the second pixel element based at least on a selection state of the shared output circuit.

3. The imaging sensor of claim 2, comprising:
    based at least on the shared output circuit being in the first output state, a readout circuit communicatively coupled to the floating diffusion element is configured to dump first charge representative of the detected infrared light to the floating diffusion element and convert the first charge to a first voltage;
    based at least on the shared output circuit being in the second output state, the readout circuit is configured to dump second charge representative of the detected visible light to the floating diffusion element and convert the second charge to a second voltage.

4. The imaging sensor of claim 3, comprising:
    based at least on the shared output circuit being in the first output state, the charge representative of the detected visible light is inhibited from dumping to the floating diffusion element by the first potential barrier proximate to the first pixel element that is established by the shared output circuit;
    based at least on the shared output circuit being in the second output state, the charge representative of the detected infrared light is inhibited from dumping to the floating diffusion element by the second potential barrier proximate to the second pixel element that is established by the shared output circuit.

5. The imaging sensor of claim 1, comprising:
    the shared output circuit of each of the pixel structures comprises a first transfer element configured to create the first potential barrier proximate to the first pixel element and inhibit dumping of the charge to a floating diffusion element from the first pixel element when the shared output circuit is in the second output state;
    the shared output circuit comprises a second transfer element configured to create the second potential barrier proximate to the second pixel element and inhibit dumping of the charge to the floating diffusion element from the second pixel element when the shared output circuit is in the first output state.

6. The imaging sensor of claim 1, comprising:
    for each of the pixel structures, the first pixel element having an infrared light bandpass filter, and the second pixel element having at least one of a red, green, or blue light bandpass filter.

7. The imaging sensor of claim 1, comprising:
    each of the pixel structures comprising the second pixel element positioned in a marginal area proximate to the first pixel element on the semiconductor substrate.

8. The imaging sensor of claim 1, comprising:
    for each of the pixel structures, the first pixel element configured to detect the infrared light through the semiconductor substrate, and the second pixel element configured to detect the visible light through a cavity in the semiconductor substrate that reduces a thickness of the semiconductor substrate through which the visible light travels to reach the second pixel element.

9. A method of operating a pixel arrangement formed on a semiconductor substrate, the method comprising:
receiving first light in a first pixel;
receiving second light in a second pixel concurrent with the first pixel receiving the first light;
in a first output state, transferring first light-generated charge from the first pixel to a shared floating diffusion element for readout as a first voltage level, and inhibiting transfer of second light-generated charge from the second pixel to the shared floating diffusion element using at least a first potential barrier formed by at least a transfer gate associated with the second pixel; and
in a second output state, transferring second light-generated charge from the second pixel to the shared floating diffusion element for readout as a second voltage level, and inhibiting transfer of the first light-generated charge from the first pixel to the shared floating diffusion element using at least a second potential barrier formed by at least a transfer gate associated with the first pixel.

10. The method of claim 9, further comprising:
resetting the shared floating diffusion element after readout of the first light-generated charge from the first pixel; and
resetting the shared floating diffusion element after readout of the second light-generated charge from the second pixel.

11. The method of claim 9, wherein the shared floating diffusion element comprises a floating diffusion region of the semiconductor substrate configured to receive charges from the first pixel or the second pixel based at least on potentials formed by transfer gates associated with each of the first pixel and the second pixel.

12. An imaging sensor, comprising:
a semiconductor substrate comprising an array of pixel structures for concurrently sensing infrared light and visible light;
each of the pixel structures comprising:
a first pixel element configured to detect the infrared light;
a second pixel element configured to detect the visible light;
a shared output circuit that couples the first pixel element and the second pixel element such that a first output state presents a first signal corresponding to detected infrared light of the first pixel element and a second output state presents a second signal corresponding to detected visible light of the second pixel element;
a first transfer element configured to create a potential barrier proximate to the first pixel element and inhibit dumping of charge to a floating diffusion element from the first pixel element when the shared output circuit is in the second output state; and
a second transfer element configured to create a potential barrier proximate to the second pixel element and inhibit dumping of charge to the floating diffusion element from the second pixel element when the shared output circuit is in the first output state.

13. An imaging sensor, comprising:
a semiconductor substrate comprising an array of pixel structures for concurrently sensing infrared light and visible light;
each of the pixel structures comprising:
a first pixel element configured to detect the infrared light;
a second pixel element configured to detect the visible light; and
a shared output circuit that couples the first pixel element and the second pixel element;
wherein based at least on the shared output circuit being in a first output state, the shared output circuit inhibits charge representative of the detected visible light from dumping to a floating diffusion element by a first potential barrier proximate to the first pixel element that is established by the shared output circuit, and presents a first signal corresponding to detected infrared light of the first pixel element; and
wherein based at least on the shared output circuit being in the second output state, the shared output circuit inhibits charge representative of the detected infrared light from dumping to the floating diffusion element by a second potential barrier proximate to the second pixel element that is established by the shared output circuit, and presents a second output state presents a second signal corresponding to detected visible light of the second pixel element.

14. An imaging sensor, comprising:
a semiconductor substrate comprising an array of pixel structures for concurrently sensing infrared light and visible light;
each of the pixel structures comprising:
a first pixel element configured to detect the infrared light through the semiconductor substrate;
a second pixel element configured to detect the visible light through an associated cavity in the semiconductor substrate that reduces a thickness of the semiconductor substrate through which the visible light travels to reach the second pixel element; and
a shared output circuit that couples the first pixel element and the second pixel element such that a first output state presents a first signal corresponding to detected infrared light of the first pixel element and a second output state presents a second signal corresponding to detected visible light of the second pixel element.

* * * * *